United States Patent
Bash et al.

(10) Patent No.: US 6,786,056 B2
(45) Date of Patent: Sep. 7, 2004

(54) COOLING SYSTEM WITH EVAPORATORS DISTRIBUTED IN PARALLEL

(75) Inventors: Cullen E. Bash, San Francisco, CA (US); Chandrakant D. Patel, Freemont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/309,188

(22) Filed: Dec. 4, 2002

(65) Prior Publication Data

US 2004/0020224 A1 Feb. 5, 2004

Related U.S. Application Data

(63) Continuation-in-part of application No. 10/210,040, filed on Aug. 2, 2002.

(51) Int. Cl.$^7$ .................................................. F25B 5/00
(52) U.S. Cl. ........................ 62/199; 62/228.4; 62/229; 62/225; 62/259.2
(58) Field of Search ................................ 62/228.4, 229, 62/199, 203, 178, 180, 186, 259.2, 225

(56) References Cited

U.S. PATENT DOCUMENTS

| | | | | |
|---|---|---|---|---|
| 3,334,684 A | | 8/1967 | Roush et al. | |
| 4,831,836 A | * | 5/1989 | Matsuoka | 62/209 |
| 4,874,127 A | * | 10/1989 | Collier | 236/49.3 |
| 5,142,877 A | | 9/1992 | Shimizu | |
| 5,181,392 A | * | 1/1993 | Itoh et al. | 62/160 |
| 5,222,371 A | | 6/1993 | Doyama et al. | |
| 5,253,482 A | | 10/1993 | Murway | |
| 5,365,749 A | | 11/1994 | Porter | |
| 5,600,962 A | | 2/1997 | Aizawa et al. | |
| 5,718,628 A | * | 2/1998 | Nakazato et al. | 454/184 |
| 5,737,931 A | | 4/1998 | Ueno et al. | |
| 6,205,803 B1 | | 3/2001 | Scaringe | |
| 6,283,380 B1 | * | 9/2001 | Nakanishi et al. | 236/49.3 |
| 6,374,627 B1 | * | 4/2002 | Schumacher et al. | 62/259.2 |
| 6,494,050 B2 | * | 12/2002 | Spinazzola et al. | 62/89 |
| 6,557,357 B2 | * | 5/2003 | Spinazzola et al. | 62/89 |
| 6,557,624 B1 | * | 5/2003 | Stahl et al. | 165/53 |

* cited by examiner

Primary Examiner—Marc Norman

(57) ABSTRACT

A system and method for cooling a room configured to house a plurality of computer systems. A plurality of evaporator units are arranged in parallel and are configured to receive air from the room and to deliver air to the room. The evaporator units are supplied with refrigerant operable to cool the received air in the evaporator units. The air may be controlled in response to temperatures sensed at one or more locations in the room.

44 Claims, 13 Drawing Sheets

COOLING SYSTEM WITH EVAPORATORS DISTRIBUTED IN PARALLEL

CROSS-REFERENCES

The present invention is a continuation-in-part of co-pending U.S. application Ser. No. 10/210,040, filed Aug. 2, 2002, and entitled "COOLING SYSTEM", by Patel et al., and is related to the following applications: co-pending U.S. application Ser. No. 10/309,196, filed Dec. 4, 2002, and entitled "COOLING SYSTEM WITH EVAPORATORS DISTRIBUTED IN SERIES" by Bash et al.; co-pending U.S. application Ser. No. 09/970,707, filed Oct. 5, 2001, and entitled "SMART COOLING OF DATA CENTERS", by Patel et al.; U.S. application Ser. No. 10/157,892 filed on May 31, 2002 entitled "CONTROLLED COOLING OF A DATA CENTER", by Patel et al.; U.S. application Ser. No. 10/122,010, filed on Apr. 24, 2002, and entitled, "DATA CENTER ENERGY MANAGEMENT SYSTEM", by Friedrich et al.; and pending U.S. application Ser. No. 09/801,909, filed Mar. 9, 2001, and entitled "MULTI-LOAD REFRIGERATION SYSTEM WITH MULTIPLE PARALLEL EVAPORATORS", by Bash et al., all of which are assigned to the assignee of the present invention and are incorporated by reference herein in their entireties.

FIELD OF THE INVENTION

This invention relates generally to cooling systems.

BACKGROUND OF THE INVENTION

A data center may be defined as a location, e.g., room, that houses computer systems arranged in a number of racks. A standard rack may be defined as an Electronics Industry Association (EIA) enclosure, 78 in. (2 meters) wide, 24 in. (0.61 meter) wide and 30 in. (0.76 meter) deep. Standard racks may be configured to house a number of computer systems, e.g., about forty (40) systems, with future configurations of racks being designed to accommodate up to eighty (80) systems. The computer systems typically include a number of components, e.g., one or more of printed circuit boards (PCBs), mass storage devices, power supplies, processors, micro-controllers, semi-conductor devices, and the like, that may dissipate relatively significant amounts of heat during the operation of the respective components. For example, a typical computer system comprising multiple microprocessors may dissipate approximately 250 W of power. Thus, a rack containing forty (40) computer systems of this type may dissipate approximately 10 KW of power.

The power required to transfer the heat dissipated by the components in the racks to the cool air contained in the data center is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling fluid, e.g., air, cooling fluid, etc., across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of the racks.

Conventional data centers are typically cooled by operation of one or more air conditioning units. For example, compressors of air conditioning units typically require a minimum of about thirty (30) percent of the required operating energy to sufficiently cool the data centers. The other components, e.g., condensers, air movers (fans), etc., typically require an additional twenty (20) percent of the required cooling capacity. As an example, a high density data center with 100 racks, each rack having a maximum power dissipation of 10 KW, generally requires 1 MW of cooling capacity. Air conditioning units with a capacity of 1 MW of heat removal generally requires a minimum of 300 KW input compressor power in addition to the power needed to drive the air moving devices, e.g., fans, blowers, etc. Conventional data center air conditioning units do not vary their cooling fluid output based on the distributed needs of the data center. Instead, these air conditioning units generally operate at or near a maximum compressor power even when the heat load is reduced inside the data center.

The substantially continuous operation of the air conditioning units is generally designed to operate according to a worst-case scenario. For example, air conditioning systems are typically designed around the maximum capacity and redundancies are utilized so that the data center may remain on-line on a substantially continual basis. However, the computer systems in the data center may only utilize around 30–50% of the maximum cooling capacity. In this respect, conventional cooling systems often attempt to cool components that may not be operating at a level which may cause their temperatures to exceed a predetermined temperature range. Consequently, conventional cooling systems often incur greater amounts of operating expenses than may be necessary to sufficiently cool the heat generating components contained in the racks of data centers.

Moreover, the future of data center cooling will involve many small (1,000 to 2,000 sq. ft.) and readily deployable data centers that are akin to portable buildings or shipping containers. Current cooling systems, such as chilled water units, are relatively time-consuming to install and difficult to use in such compact data centers.

SUMMARY OF THE INVENTION

According to one embodiment, the present invention pertains to a method for cooling a room configured to house a plurality of computer systems. In the method there is provided a plurality of evaporator units that are distributed in parallel and that are configured to receive air from the room and to deliver air to the room. The plurality of evaporator units are supplied with refrigerant that is operable to cool the air received from the room. In addition, temperatures are sensed at one or more locations in the room and the temperature of the air is controlled in response to the sensed temperatures at the one or more locations.

According to another embodiment, the invention relates to a system for cooling a room containing a plurality of computer systems. The system includes a plurality of evaporator units that are distributed in parallel and that are configured to receive refrigerant through a refrigerant line and to receive air. The air may be cooled through heat transfer with the refrigerant, and the plurality of evaporator units have at least one fan that is configured to cause air to flow out of the plurality of evaporator units. An evaporator controller is operable to control a supply of the refrigerant to the plurality of evaporator units and is operable to control the speed of the at least one fan. A refrigeration system is provided for cooling the refrigerant, and a refrigeration system controller is configured to operate the refrigeration system to vary the temperature of the refrigerant.

According to yet another embodiment, the present invention pertains to a system for cooling computer systems housed in one or more racks maintained in a room. The system includes means for cooling air including means for receiving cooling fluid. The system also includes means for delivering cooled air to the computer systems and means for measuring temperatures at one or more locations in the room. Additionally, the system includes means for controlling delivery of the cooled air in response to the means for measuring, and a means for controlling the temperature of the cooling fluid.

According to still another embodiment, the present invention pertains to computer readable storage medium on which is embedded one or more computer programs that implement a method of cooling a room configured to house a plurality of computer systems. The one or more computer programs include a set of instructions for providing a plurality of evaporator units that are distributed in parallel and that are configured to receive air from the room and to deliver air to the room. The plurality of evaporator units are supplied with refrigerant that is operable to cool the air received from the room. In addition, temperatures are sensed at one or more locations in the room and the temperature of air is controlled in response to the sensed temperatures at the one or more locations.

BRIEF DESCRIPTION OF THE DRAWINGS

Features of the present invention will become apparent to those skilled in the art from the following description with reference to the figures, in which.

DETAILED DESCRIPTION OF THE INVENTION

Figure 1:
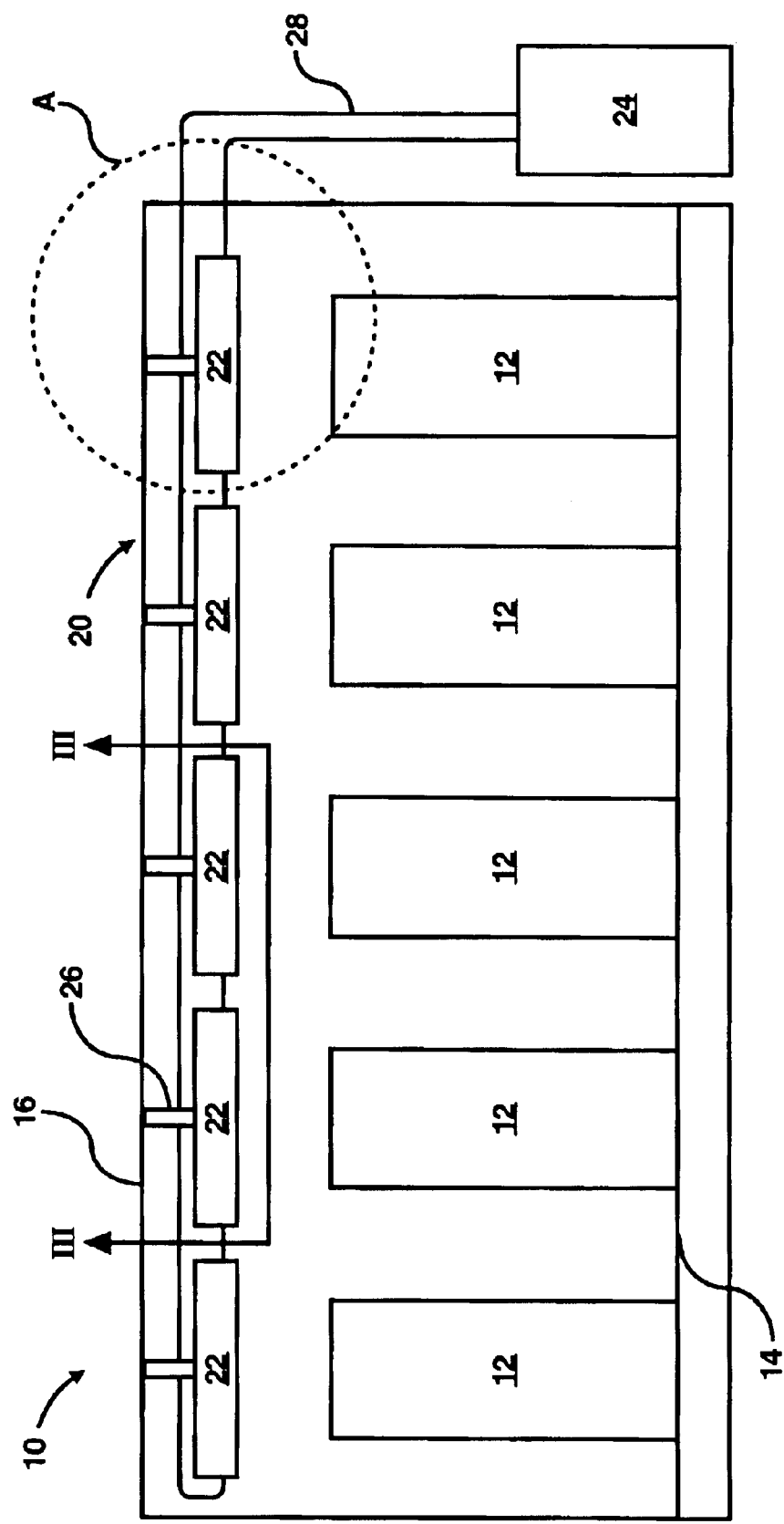
FIG. 1 shows a simplified schematic illustration of a room containing a cooling system in accordance with an embodiment of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

According to an embodiment of the present invention, a cooling system may include a heat exchanger unit (HEU) configured to receive cooling fluid (e.g., chilled water, R134a, ethylene glycol mixture, and the like). The HEU may be designed to cause air to exchange heat with the cooling fluid to thereby cool the air. The HEU may also be designed to deliver the cooled air to one or more computer systems. The cooling system may also include a cooling device operable to cool the cooling fluid. The cooling device may comprise one or more of known cooling systems (e.g., a closed loop refrigeration cycle configured to transfer heat with the cooling fluid). The cooling device may therefore include a second generally closed-loop system having refrigerant flowing through a refrigerant line and positioned to receive heat from the cooling fluid.

One or more controllers may be provided to operate the cooling system components. The one or more controllers may be configured to monitor environmental conditions within the room, and more particularly in areas around predetermined computer systems, and manipulate operation of the HEU and the cooling device according to the monitored environmental conditions. For example, the one or more controllers may control the temperature of the cooling fluid and/or the output of the HEU.

In one respect, by manipulating the output of the HEU and the temperature of the cooling fluid, the amount of energy required to cool the computer systems may be relatively low. Thus, according to the embodiment described above, instead of operating components of the cooling device, e.g., compressors, heat exchangers, fans, etc., at substantially 100 percent of the anticipated heat dissipation from the computer systems, those components may be operated according to the actual cooling needs. In addition, the computer systems and the racks in which they are housed may be positioned throughout the room according to their anticipated heat loads, to additionally increase control over the energy required by the cooling system. Furthermore, as described in U.S. application Ser. No. 10/122,010, filed on Apr. 24, 2002, the loads may be distributed between various computer systems to further increase energy efficiency of air conditioning resources.

In another respect, the positioning of the racks may be determined through implementation of numerical modeling and metrology of the cooling fluid flow throughout the data center. In addition, the numerical modeling may be implemented to determine the volume flow rate and velocity of the cooling fluid flow through each of the HEU's.

A more detailed description of the above-described embodiment may be found in co-pending U.S. application Ser. No. 09/970,707, filed Oct. 5, 2001, which is assigned to the assignee of the present invention and is incorporated by reference herein in its entirety.

Referring first to FIG. 1, there is illustrated a room 10, e.g., a data center, housing a plurality of racks 12, and a cooling system 20. Also illustrated is a raised floor 14 that may be provided to enable placement of wires, tubes, and the like for delivery into and from the racks 12.

The racks 12 may generally house a plurality of components (not shown), e.g., processors, micro-controllers, memories, semi-conductor devices, and the like. The components may be elements of a plurality of subsystems (not shown), e.g., computers, servers, etc. The subsystems and the components may be implemented to perform various electronic, e.g., computing, switching, routing, displaying, and the like, functions. In the performance of these electronic functions, the components, and therefore the subsystems, may dissipate relatively large amounts of heat. Because the racks 12 have been generally known to include upwards of forty (40) or more subsystems, they may require substantially large amounts of cooling fluid to maintain the subsystems and the components generally within a predetermined operating temperature range. According to an embodiment of the invention, by substantially controlling the amount of cooling air delivered to the components and the subsystems located in the racks 12 based upon their respective heat loads, the power consumed by the cooling system 20 to cool and supply the cooling fluid may also be controlled.

The cooling system 20 is illustrated as including a plurality of HEU's 22 and a cooling device 24. The HEU's 22 may be supported from a ceiling 16 of the room 10 by one or more supports 26. The HEU's 22 may comprise any reasonably suitable air conditioning unit designed to receive air and to deliver the received air, e.g., the DATACOOL environmental control system manufactured and distributed by Liebert of Irvine, Calif. As can be seen in FIG. 1, the HEU's 22 are positioned to receive air that may become heated by virtue of the heat dissipated by, for example, the computer systems located in the racks 12. Although an HEU 22 is illustrated as positioned over a rack 12, it should be understood that the HEU's 22 may be positioned at various other locations. For example a plurality of HEU's 22 may be positioned to cool a single rack. Determinations of HEU 22 placement within the room 10 may be predicated upon techniques designed to optimize cooling performance and/or energy efficiency.

The HEU's 22 may be positioned to generally supply the racks 12 with cooling air. More particularly, the HEU's 22 may be positioned to supply cooling air to the racks 12 in accordance with their heat dissipation. By way of example, computer systems that undergo higher loads are known to generate greater amounts of heat as compared to computer systems that undergo lower or no loads. Thus, the HEU's 22 may be positioned and operated to supply those computer systems (and racks 12) that generate greater amounts of heat with greater mass flow rates of cooling air and/or relatively lower temperature air. In addition, those computer systems (and racks 12) that generate little or no heat, may likewise, receive little or no cooling air and/or relatively higher temperature air. In this respect, the amount of energy required to operate the HEU's 22 specifically, and the cooling system 20 as a whole, may be substantially optimized according to the demands of the computer systems.

Alternatively, or additionally to the above, because usage of the computer systems contained in the racks 12 may vary at different times of the day, instead of varying the position of the HEU's 22, the load placed on the computer systems may be varied. For instance, as described in co-pending U.S. application Ser. No. 10/122,010, the work load on some of the computer systems may be performed by other computer systems to substantially maximize energy efficiency of the cooling system. In this regard, the load may be transferred, for example, to one location in the room 10 if it is determined that such a load transfer is more energy efficient than under normal operating conditions. Moreover, the load transfer may occur at different times of the day and as load requirements vary.

The cooling device 24 may comprise any reasonably suitable type of cooling device designed to adequately cool the cooling fluid. In addition, the cooling device 24 may include the capability of varying the temperature of the cooling fluid. Some suitable cooling devices may include those that implement air conditioners, heat exchangers, heat pumps, variable capacity chillers, evaporative cooling systems, and the like. For example, the cooling device 24 may comprise a closed-loop refrigeration cycle apparatus having a heat transfer section where the heat from the cooling fluid in a fluid line 28 may be transferred to refrigerant contained in the closed-loop refrigeration cycle apparatus.

Although the cooling device 24 is illustrated as being located outside of the room 10, it should be understood that the cooling device 24 may be positioned within the room 24 without deviating from the scope of the present invention.

The cooling fluid may be configured to flow through the HEU's 22 and return to the cooling device 24 via fluid lines 28. As seen in FIG. 1, the fluid line 28 generally forms a closed loop system in which the cooling fluid may become heated in the HEU's 22 and cooled in the cooling device 24.

Although one room 10 is illustrated in FIG. 1, it should be understood that the room 10 may comprise more than one room and that the cooling system 20 may be configured to cool a plurality of rooms.

Figure 2:
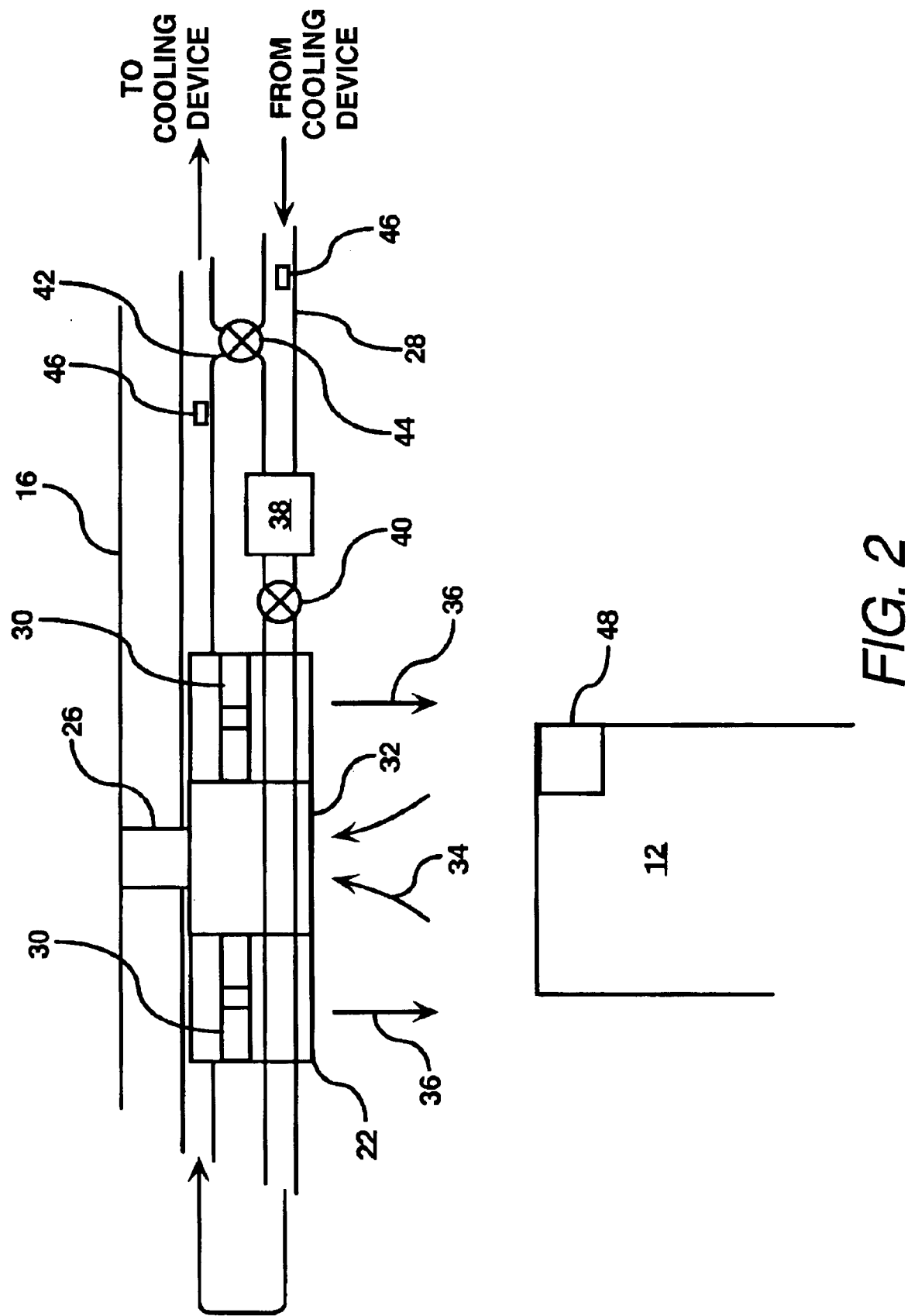
FIG. 2 is an enlarged partly cross-sectional view of section A in FIG. 1.

With reference now to FIG. 2, there is illustrated an enlarged partly cross-sectional view of section A in FIG. 1. As seen in FIG. 2, the HEU 22 generally comprises, among other things, a plurality of fans 30 and an opening 32. The fans 30 are designed to cause air from the room 10 to flow into the opening 32, as indicated by arrows 34. The fans 30 are also configured to cause the air to flow back out into the room 10, in the manner indicated by arrows 36. It should be understood that the HEU 22 may include additional components and that some of the components described may be removed and/or modified without departing from the scope of the invention.

The fluid line 28 is situated to run through the HEU 22 below the fans 30 and in the direction of air flow from the HEU 22 to the room 10. In this respect, as the air flows by the fluid line 28, heat may be transferred from the air to the cooling fluid contained in the fluid line 28. Consequently, the air flowing out of the HEU 22 may be at a lower temperature relative to the air entering the HEU 22.

A pump 38 may be provided along the fluid line 28 at a location generally upstream of the HEU 22. The pump 38 may be designed to apply sufficient pressure to the cooling fluid entering the HEU 22 to enable the cooling fluid to flow at a predetermined rate through the HEU 22. In this respect, the pump 38 may comprise any pump capable of performing the above-described operations in a reasonably suitable manner. The pump 38 may be configured to supply cooling fluid to a plurality of HEU's 22 and to control the pressure of the cooling fluid flowing through one or more of the HEU's 22. A valve 40 is illustrated between the pump 38 and the HEU 22 along the fluid line 28. The valve 40 may be an electronically controllable valve capable of varying the flow of cooling fluid through the fluid line 28, as well as substantially stopping the flow of the cooling fluid. As a result, the volume flow rate of the cooling fluid through the fluid line 28 extending through the HEU 22 may be manipulated at predetermined levels such that the temperature of the air flowing out of the HEU 22 may be substantially optimized.

Although the pump 38 and the valve 40 are illustrated as separate components, it should be understood that their respective functions may be performed by a single component, e.g., the pump 38. In this example, the pump 38 may be configured as a variable speed pump configured to vary the flow of cooling fluid through the HEU 22.

A pipe 42 may be located along the fluid line 28 at a location downstream of the HEU 22. The pipe 42 may enable cooling fluid that has passed through the HEU 22 to be introduced into cooling fluid entering into the HEU 22. A pipe valve 44 may be positioned along the pipe 42 to substantially control the amount of this cooling fluid introduced into the cooling fluid entering into the HEU 22. The pipe valve 44 may be any reasonably suitable valve (e.g., a three-way valve) capable of controlling the cooling fluid flow through the pipe 42.

In this respect, the temperature of the cooling fluid may thus be further controlled. By way of example, the temperature of the cooling fluid may be increased prior to its introduction into an HEU 22 in a multi-HEU system (see e.g., FIG. 3). In this type of configuration, when one rack 12 is dissipating a greater amount of heat relative to another rack 12, the temperature of cooling air flow supplied to each of these racks may differ from one another. That is, the rack 12 dissipating the greater amount of heat may receive air flow from a first HEU 22 that is at a lower temperature compared to the rack that is dissipating a lesser amount of heat. Consequently, the temperature of the cooling fluid introduced into that first HEU may be at a lower temperature than the cooling fluid introduced into a second HEU.

Temperature sensors 46 may be located in a supply portion and a return portion of the fluid line 28 such that a determination may be made as to changes in the cooling fluid temperature prior to and following flow through the HEU 22. This information may be implemented to determine the amount of return cooling fluid to be introduced into the supply portion of the fluid line 28.

A temperature sensor 48 e.g., a thermocouple or the like, is illustrated on the rack 12. A single temperature sensor 48 is depicted in FIG. 2 for purposes of simplicity, it should, however, be understood that a plurality of temperature sensors 48 may be positioned at various locations of the rack 12 as well as other areas of the room 12. The temperature sensor 48 may supply temperature readings to a controller (not shown) configured to operate the HEU 22, the pump 38, the valve 40, and the pipe valve 44. In addition, the temperature readings may also be supplied to a controller (not shown) configured to operate the cooling device 24. The manner of information transmittal between the temperature sensor 48 and the controllers may comprise any reasonably suitable arrangement, e.g., wired or wireless connection.

In place of, or in addition to, the temperature sensor 48, a mobile device (not shown) designed to gather or measure at least one local environmental condition (e.g., temperature, air flow, humidity, etc.) in the room 10 may be implemented. By way of example, a suitable mobile device may comprise the environmental condition detecting device described in co-pending U.S. application Ser. No. 10/157,892, filed on May 31, 2002 entitled "CONTROLLED COOLING OF A DATA CENTER", by Patel et al., which is assigned to the assignee of the present invention and incorporated by reference herein in its entirety. Information gathered by the mobile device may be transmitted to the controller, which may vary operation of the cooling system 20 in response to the information.

Alternatively, or in addition to, the above-described environmental condition sensing devices, the amount of heat generated by the computer systems contained in the racks 12, and the resulting necessary cooling requirements, may be anticipated according to the amount of load placed on the computer systems. A suitable method of implementing anticipated sensing is described in co-pending U.S. application Ser. No. 09/970,707, which is assigned to the assignee of the present invention and incorporated by reference herein in its entirety.

Figure 3:
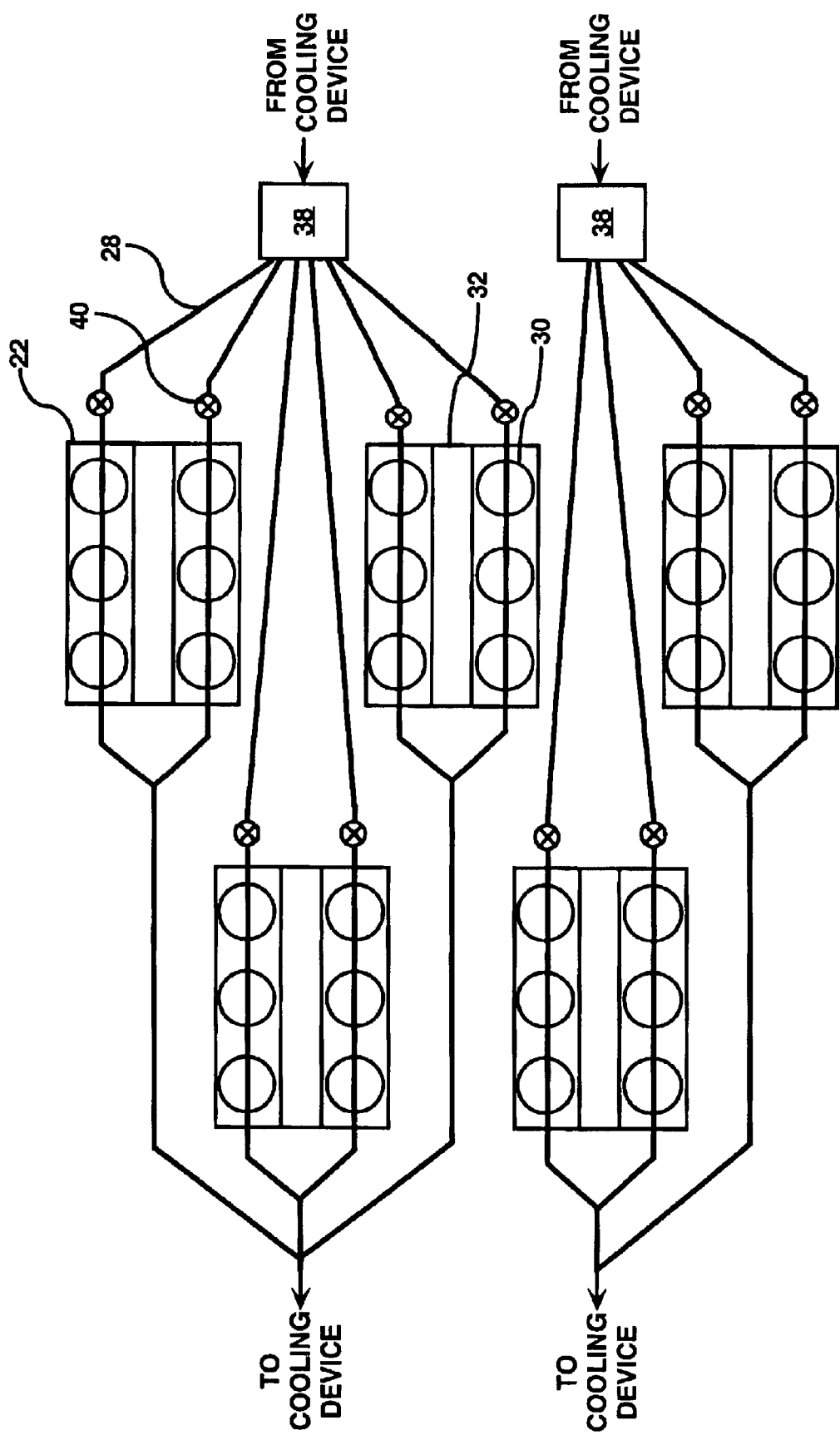
FIG. 3 is a schematic illustration taken along lines III—III of FIG. 1.

Referring now to FIG. 3, there is shown a schematic illustration taken along lines III—III of FIG. 1. FIG. 3 illustrates a plurality of HEU's 22 and a plurality of fluid lines 28 emanating from a pair of pumps 38. The illustration also shows that the HEU's 22 include rows of fans 30 located adjacent to the openings 32. Situated beneath each of the fans 30 are fluid lines 28. In addition, located generally upstream of the HEU's 22 are respective valves 40, which may comprise three-way valves. As can be seen in FIG. 3, the pumps 38 may control the supply of cooling fluid through a plurality of HEU's 22. In addition, it may be seen that the valves 40 generally enable control of cooling fluid flow through respective fluid lines 28.

In this respect, the temperature of the air flowing out of the HEU's 22, and more specifically, out of each side of the HEU's 22 may be controlled in substantially independent manners (e.g., by operation a three-way valves (not shown)). In one regard, the flow of cooling fluid through certain HEU's 22 may be restricted or substantially halted, for instance, in situations where the computer systems for which an HEU 22 is configured to cool are in idle states. It should be understood that the configuration of HEU's 22, pumps 38, fluid lines 28, and valves 40 depicted in FIG. 3 is but one manner of a variety of different obtainable configurations. It should also be understood that the specific configuration for any given room may depend upon a multitude of factors, e.g., cooling needs, room configuration, cooling device type, etc. In addition, the fluid lines 28 may be positioned above the fans 30 such that air may substantially be cooled prior to flowing into the fans 30 without deviating from the scope of the present invention.

Figure 4:
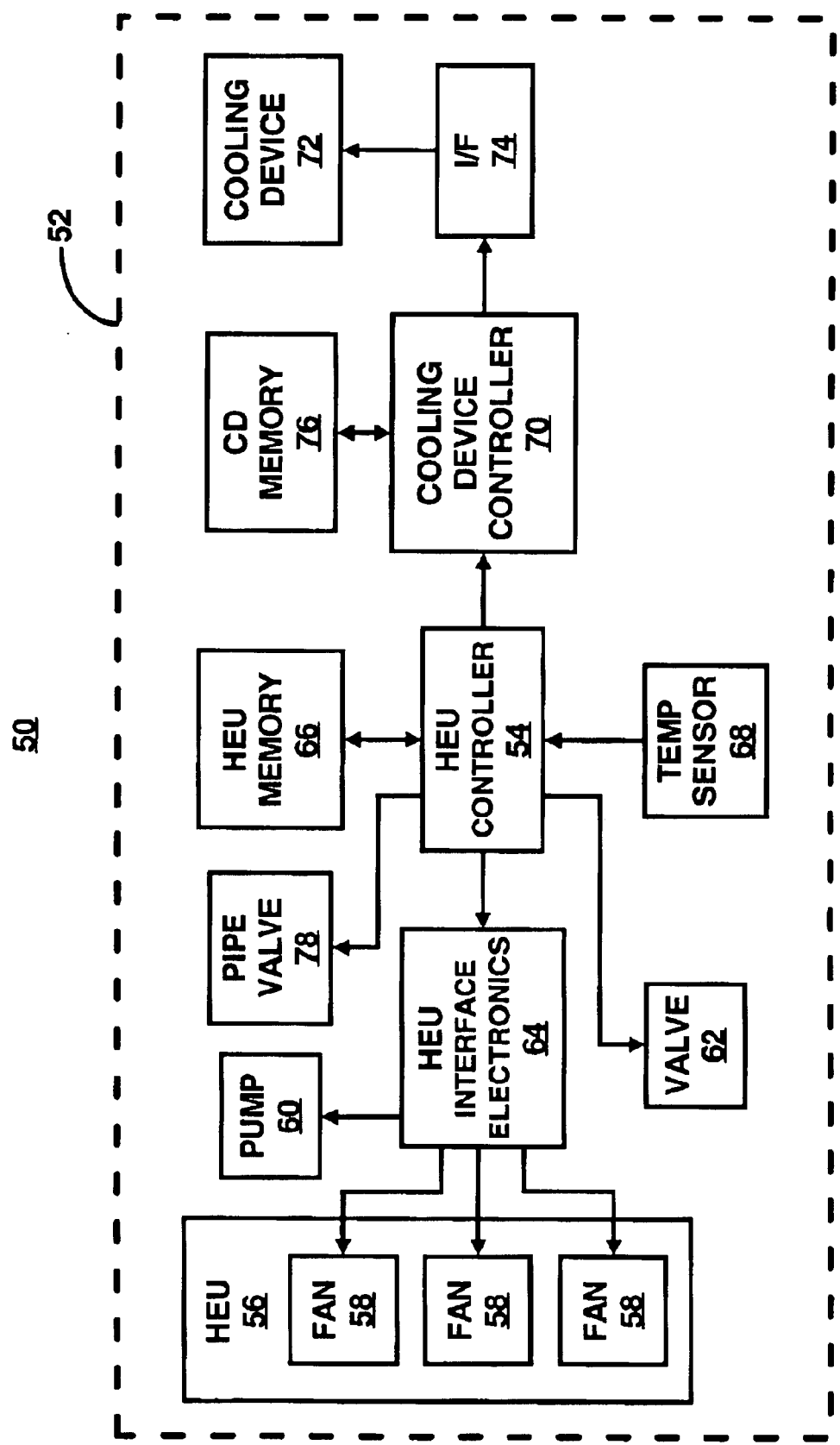
FIG. 4 is an exemplary block diagram for a cooling system according to an embodiment of the invention.

FIG. 4 is an exemplary block diagram 50 for a cooling system 52 according to an embodiment of the invention. It should be understood that the following description of the block diagram 50 is but one manner of a variety of different manners in which such a cooling system 52 may be operated. In addition, it should be understood that the cooling system 52 may include additional components and that some of the components described may be removed and/or modified without departing from the scope of the invention.

The cooling system 52 includes an HEU controller 54 configured to control the operations of the HEU 56. The HEU controller 54 may comprise a microprocessor, a microcontroller, an application specific integrated circuit (ASIC), and the like. The HEU controller 54 may, for example, control the speed of the fans 58, the operation of the pump 60, the valve 62, and the pipe valve 78. Interface electronics 64 may be provided to act as a control interface between the HEU controller 54 and the HEU 56, pump 60, and valve 62. Alternatively, a control interface my be omitted between the HEU controller 54 and the above-described components as seen with respect to the connection between the HEU controller 54 and, for example, the pipe valve 78. The HEU controller 54 may also be interfaced with a temperature sensor 68, e.g., one or more of the temperature sensors described hereinabove with respect to FIG. 2.

The HEU controller 54 may be interfaced with an HEU memory 66 configured to provide storage of a computer software that provides the functionality of the HEU controller 54, e.g., the speed of the fans, pump operation, etc. The HEU memory 66 may be implemented as a combination of volatile and non-volatile memory, such as dynamic random access memory (DRAM), EEPROM, flash memory, and the like. The HEU memory 66 may also be configured to provide a storage for containing data and/or information pertaining to the manner in which HEU controller 54 may operate the fans 58, the pump 60, the valve 62, and the pipe valve 78. In one respect, the manner of operation of the above-described components may be based according to temperature measurements by the temperature sensor 68.

The HEU controller 54 may be further interfaced with a cooling device controller 70. The interface may be effectuated via a wired protocol, such as IEEE 802.3, etc., wireless protocols, such as IEEE 801.11b, wireless serial connection, Bluetooth, etc., or combinations thereof.

The cooling device controller 70 may be configured to control the operations of the cooling device 72. The cooling device controller 70 may comprise a microprocessor, a microcontroller, an application specific integrated circuit (ASIC), and the like. The cooling device controller 70 is generally configured to manipulate the temperature of the cooling fluid by controlling the operation of the cooling device 72. In this regard, the cooling device 72 may comprise a variable speed compressor, a heat exchanger, a chilled water heat exchanger, a centrifugal chiller, and the like. More particularly, the cooling device controller 70 may be designed to vary the operation of one or more of the above-recited components to vary the amount of heat transfer on the refrigerant contained in the refrigeration loop of the cooling device 72 to thereby vary the cooling fluid temperature.

Interface electronics (I/F) 74 may be provided to act as an interface between the cooling device controller 70 and the components for operating the cooling device 72, e.g., the supply of voltage to vary the speed of the compressor, control of the heat exchanger (centrifugal chiller) capacity, etc.

The cooling device controller 70 may also be interfaced with a cooling device (CD) memory 76 configured to provide storage of a computer software that provides the functionality of the cooling device 72, e.g., compressor, heat exchanger, and the like, and may be executed by the cooling device controller 70. The CD memory 76 may be implemented as a combination of volatile and non-volatile memory, such as DRAM, EEPROM, flash memory, and the like. The CD memory 76 may also be configured to provide a storage for containing data/information pertaining to the manner in which the compressor (heat exchanger, chiller) may be manipulated in response to, for example, variations in the temperature of the cooling fluid and/or air in the room.

In one respect, the capacity (e.g., the amount of work exerted on the cooling fluid) of the compressor (heat exchanger, chiller, etc.) may be modified to thereby control the temperature and of the cooling fluid. The compressor (heat exchanger, chiller, etc.) may thus be controlled to either increase or decrease the mass flow rate of the refrigerant flowing therethrough. Consequently, when the temperature in the room 10 is below a predetermined range, the capacity of the (heat exchanger, chiller, etc.) may be reduced to substantially reduce the amount of work, thus the amount of energy exerted on the refrigerant. This may lead to a significant reduction in the costs associated with operating the cooling system 52 as compared with conventional cooling systems.

Because the specific type of compressor (heat exchanger, chiller, etc.) to be employed with embodiments of the invention may vary according to individual needs, the invention is not limited to any specific type of compressor (heat exchanger, chiller, etc.). Instead, any reasonably suitable type of compressor (heat exchanger, chiller, etc.) capable of accomplishing certain aspects of the invention may be employed with the embodiments of the invention. The choice of compressor (heat exchanger, chiller, etc.) may therefore depend upon a plurality of factors, e.g., cooling requirements, costs, operating expenses, etc.

By way of example, if there is a detected or anticipated change in the temperature of a rack, e.g., rack 12, areas surrounding the rack 12, etc., the HEU controller 54 may operate to manipulate the corresponding HEU 56 and/or fan(s) 58 to compensate, e.g., change the volume flow rate, velocity, and other characteristic of the air flow, for the change in temperature. In addition, or as an alternative to the above, the cooling device controller 70 may operate to cause the cooling device 72 to lower the refrigerant temperature. In this respect, each of the racks 12 and/or portions thereof may generally receive substantially only the amount of cooling air necessary to maintain the temperature of the racks 12 within a predetermined temperature range. In addition, the refrigerant, and therefore the cooling fluid, temperature may also be controlled as needed to substantially optimize cooling of the racks 12. By controlling the cooling air flow in the above-described manner, the cooling system 52 may be operated at substantially optimized levels, thereby decreasing the amount of energy and thus the operating costs required to cool the computer systems in the racks 12.

Moreover, the cooling device controller 70 may operate the compressor (heat exchanger, chiller, etc.) in a manner to vary the cooling fluid temperature in response to various degrees of detected increases/decreases in the operation of the HEU 56. More particularly, a look up table (not shown) may be stored in the CD memory 76. The look up table may include information pertaining to the level of compressor speed (heat exchanger capacity, etc.) increase necessary for a detected increase in the operation of the HEU 56. In this respect, the compressor speed (heat exchanger capacity, etc.) may be varied substantially incrementally in response to detected changes in the operation of the HEU 56.

Figure 5:
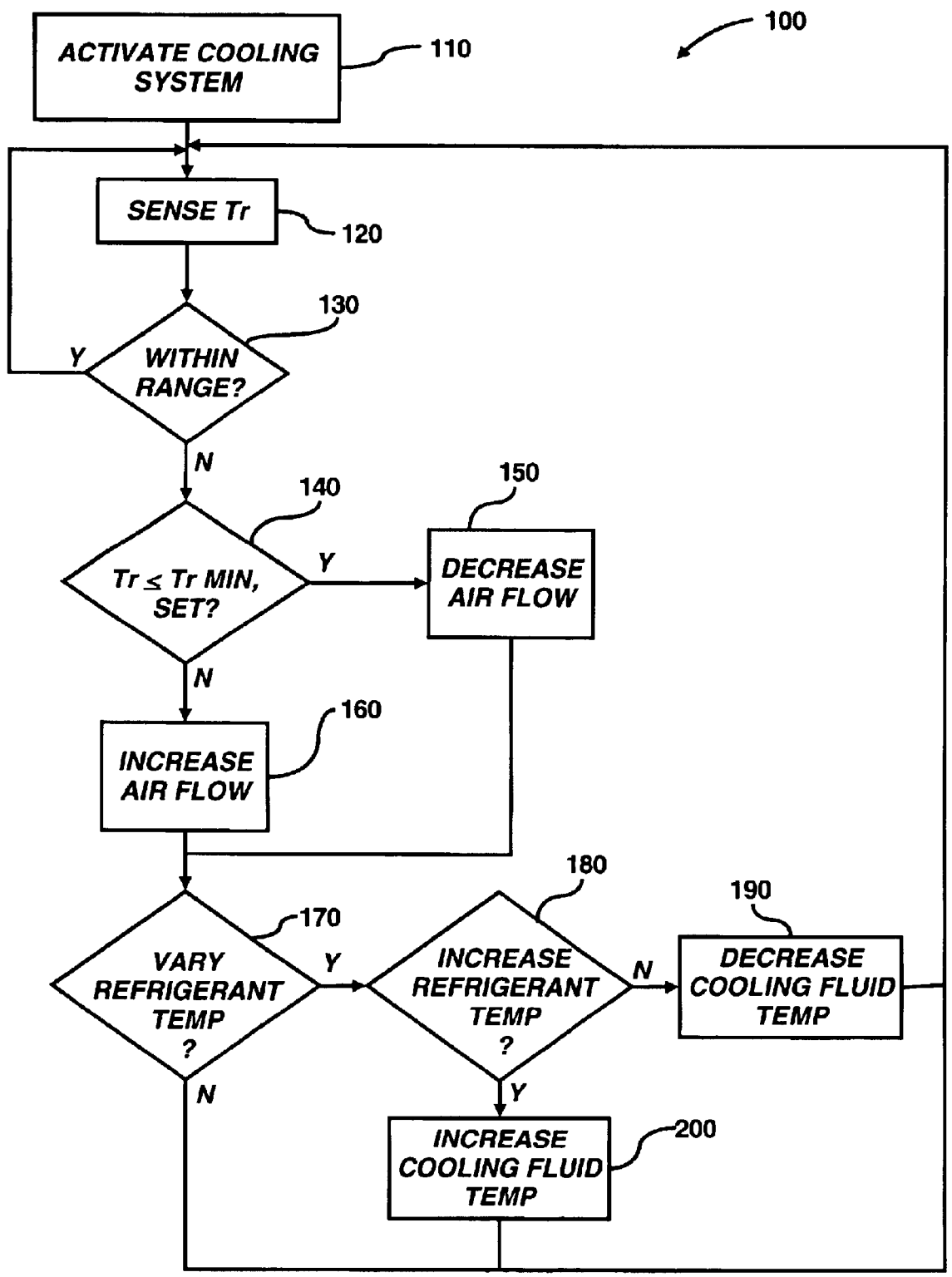
FIG. 5 shows a flow diagram of an operational mode according to an embodiment of the invention.

FIG. 5 shows a flow diagram of an operational mode 100 according to an embodiment of the invention. It should be understood that the operational mode 100 may include additional operations and that some of the operations may be removed and/or modified without departing from the scope of the invention. The following description of the operational mode 100 is made with reference to the block diagram 50 illustrated in FIG. 4, and thus makes reference to the elements cited therein.

The operations illustrated in the operational mode 100 may be contained as a utility, program, or a subprogram, in any desired computer accessible medium. In addition, the operational mode 100 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

In the operational mode 100, the cooling system 52 is activated at step 110. At step 120, the temperature of one or more racks (Tr) is sensed by temperature sensors, e.g., one or more temperature sensors 68. The temperature sensors may comprise one or more of the above-described temperature sensors, e.g., thermocouple, mobile environmental condition sensing device, etc. The Tr's generally correspond to the heat load of the heat dissipating components and therefore the computer systems contained in the racks, e.g., rack 12. Therefore, the Tr's may be based upon the temperatures of specific heat dissipating components and subsystems. In addition, the Tr's may be based upon the temperatures in the general vicinity of the racks and/or sections of the racks. Thus, those skilled in the art will understand that certain embodiments of the present invention may be employed with temperature sensors located at various positions throughout the room, e.g., room 10. Moreover, use of the term "rack" herein generally refers to racks for supporting computer systems and additionally to sections of the racks as well as areas around the racks. Therefore, the use of the term "rack" throughout the present disclosure is not meant to limit certain aspects thereof to entire racks, but instead, is relied upon to simplify the description of certain embodiments of the present invention.

As an alternative to the temperature sensor 68, the Tr's may be anticipated in the manner described hereinabove and in co-pending U.S. patent application Ser. No. 09/970,707.

At step 130, it is determined whether each of the Tr's is within a predetermined range of operating temperatures, e.g., between a maximum set point temperature (Tmax,set) and a minimum set point temperature (Tmin,set). In general, the range of temperatures Tmin,set and Tmax,set pertains to threshold temperatures to determine whether to increase or decrease the flow of cooling air delivered to the racks. This range of operating temperatures may be set according to a plurality of factors. These factors may include, for example, the operating temperatures set forth by the manufacturers of the subsystems and components located in the racks, through testing to determine the optimal operating temperatures, etc. In addition, the predetermined range of operating temperatures may vary from one subsystem to another.

For those racks having Tr's that are within the predetermined range, their temperatures are sensed again at step 120. For those racks determined to have heat loads that do not fall within the predetermined temperature range, i.e., fall outside of Tmin,set and Tmax,set, the HEU controller 54 may determine whether those racks have temperatures that are below the Tmin,set at step 140.

The air flow supplied by the HEU 56, and more particularly the fans 58, configured to supply cooling air flow to the racks having Tr's below or equal to the Tmin,set, may be decreased at step 150. In addition, and/or alternatively, the temperature of the cooling fluid supplied through the HEU's 56 may be increased to thereby increase the temperature of the air supplied to these racks. As described hereinabove, this may be accomplished by decreasing the work placed on the refrigerant by the cooling device 72 and/or by opening the bypass valve 62. Additionally, the temperature of the air flowing from the HEU 56 may also be increased by causing the valve 78 to enable a lower volume flow rate of cooling fluid to flow therethrough.

The air flow supplied by the HEU 56 configured to supply cooling air flow to the racks having Tr's above the Tmin,set, and thus above the Tmax,set, may be increased at step 160. In this regard, the HEU controller 54 may increase power to the fans 58 to enable greater air flow to the racks. In addition, and/or alternatively, the HEU controller 54 may increase the flow of cooling fluid through the HEU 56 via operation of the pump 60 and/or the valve 78.

By virtue of certain embodiments of the invention, racks having various Tr's may be supplied with air flow having various characteristics, e.g., temperature, velocity, direction, and the like. That is, for example, in a system comprising a plurality of HEU's 56, air flow may be supplied to racks having higher Tr's by certain HEU's 56 substantially simultaneously with air flow supplied to racks having relatively lower Tr's by other HEU's 56 where each of the racks receives different levels of air flow. Additionally, the temperature of the cooling fluid supplied through the HEU's 56 delivering air flow to racks having higher Tr's may be relatively lower than the temperature of the cooling fluid supplied through the HEU's 56 delivering air flow to racks having lower Tr's. It should thus be appreciated that steps 150 and 160 may be respectively and substantially simultaneously performed by various HEU's 56.

According to an embodiment of the invention, the decrease in volume flow rate and/or velocity of the air flow at step 150 and the increase in volume and/or velocity of the air flow at step 160 may be accomplished by incrementally varying the air flow from the HEU 56. For example, the volume flow rate and/or velocity of the air flow from the HEU 56 may be varied by a predetermined amount during a first iteration. The Tr may be measured at a predetermined time following the variation and steps 130–160 may be repeated. By repeating this process a number of times, the temperature of the rack may be substantially brought within the predetermined range.

At step 170, the cooling device controller 70 may determine whether to vary the cooling fluid temperature, e.g., increase the compressor speed (heat exchanger capacity, etc.). The cooling fluid temperature may be decreased in response to, for example, actual and/or detected increases in Tr. In the alternative, the decrease in cooling fluid temperature may be predicated upon the amount of work performed by the HEU 56. More particularly, as the work performed by the HEU 56 increases, thereby signaling an increase in the Tr, the cooling device controller 70 may cause the cooling device 72 to decrease the refrigerant temperature. In addition, when a plurality of HEU's 56 are implemented to cool one or more racks, the cooling device controller 70 may determine whether the total amount of decreases in the volume flow rates of the cooling air exceeds the total amount of increases in the volume flow rates flow of the cooling air. At step 180, the cooling device controller 70 may determine whether to decrease the cooling fluid temperature.

At step 190, the cooling device controller 70 may cause the cooling fluid temperature to be decreased in response to a determination to do so at step 180. Alternatively, the cooling device controller 70 may cause the cooling fluid temperature to be increased at step 200 in response to a determination to do so at step 180. As described hereinabove, the cooling device controller 70 may operate to vary the temperature of the cooling fluid by varying the speed of the compressor, capacity of the heat exchanger, and the like.

It should be understood that steps 150, 160, and 190 or 200 may be performed substantially simultaneously. More particularly, on a zonal level, temperature readings determined at step 120 for various racks may be implemented in varying the delivery of cooling air to the various racks. Additionally, on a global level, the temperature of the cooling fluid may be varied according to the changes in the cooling requirements of the racks. For example, when the temperature of a rack exceeds a predetermined threshold range, the HEU(s) 56 supplying cooling air flow to that rack may increase the air flow to that rack. Substantially concurrently, the temperature of the cooling fluid may be decreased by an amount relative to the increased rack temperature.

Following steps 190 or 200, the Tr's are sensed again at step 120. In addition, the steps following step 120 may be repeated for an indefinite period of time and may form a closed-loop pattern.

Figure 6:
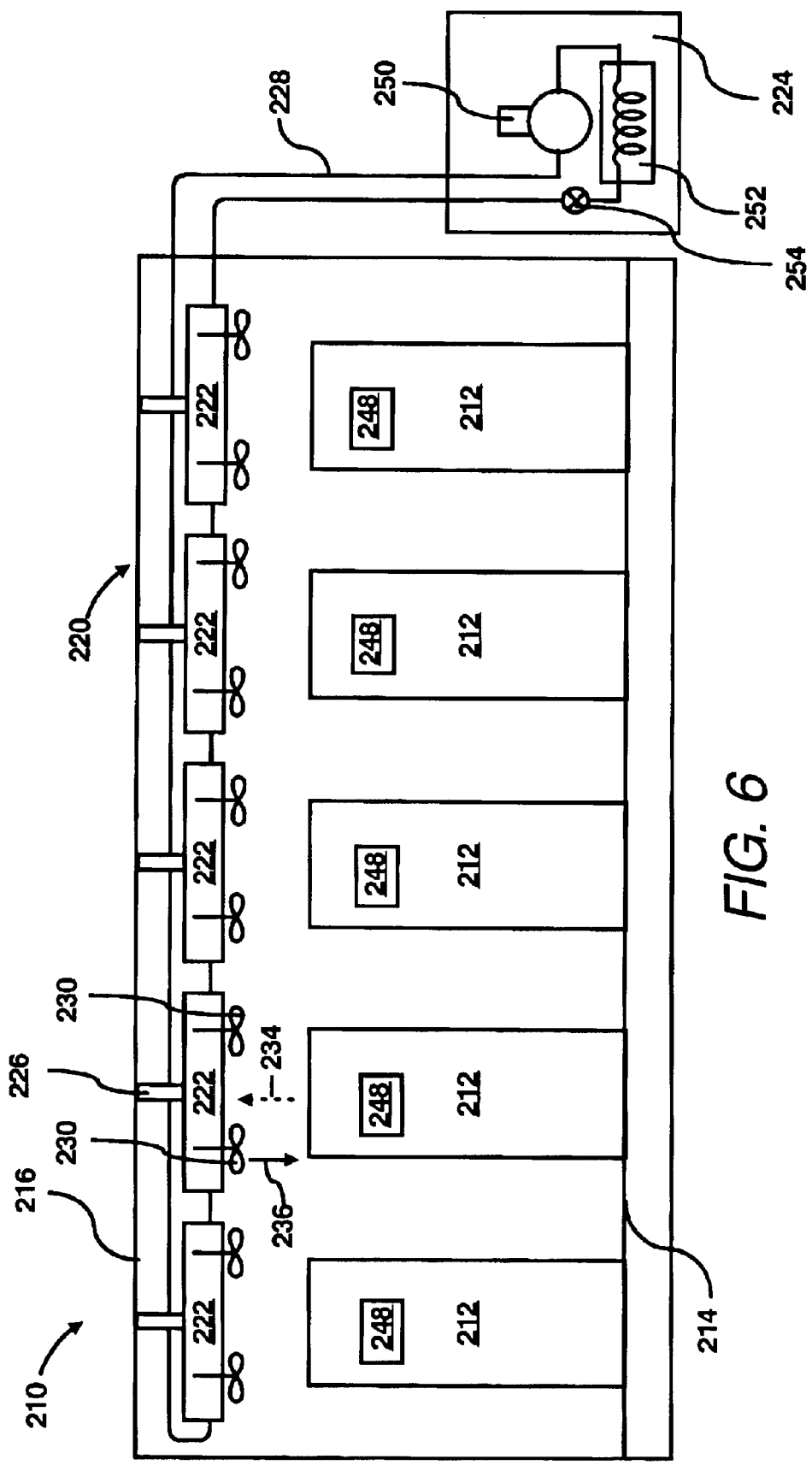
FIG. 6 shows a simplified schematic illustration of a room containing a cooling system in accordance with another embodiment of the invention.

Referring now to FIG. 6, there is illustrated a room 210, e.g., a data center, housing a plurality of computer systems or racks 212, and a cooling system 220. Also illustrated is a raised floor 214 that may be provided to enable placement of wires, tubes, and the like for delivery into and from the racks 212.

The racks 212 may generally house a plurality of components (not shown), e.g., processors, micro-controllers, memories, semi-conductor devices, and the like. The components may be elements of a plurality of subsystems (not shown), e.g., computers, servers, etc. The subsystems and the components may be implemented to perform various electronic functions, e.g., computing, switching, routing, displaying, and the like. In the performance of these electronic functions, the components, and therefore the subsystems, may dissipate relatively large amounts of heat. Because the racks 212 have been generally known to include upwards of forty (40) or more subsystems, they may require substantially large amounts of cooling fluid (e.g. air) to maintain the subsystems and the components generally within a predetermined operating temperature range. According to an embodiment of the invention, by substantially controlling the amount of cooling air delivered to the components and the subsystems located in the racks 212 based upon their respective heat loads, the power consumed by the cooling system 220 to cool and supply the cooling air may also be controlled.

The cooling system 220 is illustrated as including a plurality of HEU's, or evaporator units or evaporators 222, that are part of a cooling apparatus or refrigeration system 224. The evaporators 222 may be supported from a ceiling 216 of the room 210 by one or more supports 226. The evaporators 222 may comprise any reasonably suitable combination fan-evaporator unit or can comprise a separate fan unit (not shown) and separate evaporator unit (not shown). Finally, the terminology "evaporator" and "evaporator unit" are used synonymously herein and encompass the above-described variations.

As can be seen in FIG. 6, the evaporators 222 are positioned to receive air that may become heated by virtue of the heat dissipated by, for example, the computer systems located in the racks 212. Although an evaporator 222 is illustrated as positioned over a rack 212, it should be understood that the evaporators 222 may be positioned at various other locations. For example, a plurality of evaporators 222 may be positioned to cool a single rack. Determinations of evaporator 222 placement within the room 210 may be predicated upon techniques designed to optimize cooling performance and/or energy efficiency.

The evaporators 222 may be positioned to generally supply the racks 212 with cooling air. More particularly, the evaporators 222 may be positioned to supply cooling air to the racks 212 in accordance with their heat dissipation. By way of example, computer systems that undergo higher loads are known to generate greater amounts of heat as compared to computer systems that undergo lower or no loads. Thus, the evaporators 222 may be positioned and operated to supply those computer systems (and racks 212) that generate greater amounts of heat with greater mass flow rates of cooling air and/or relatively lower temperature air. In addition, those computer systems (and racks 212) that generate little or no heat, may likewise, receive little or no cooling air and/or relatively higher temperature air. In this respect, the amount of energy required to operate the evaporators 222 specifically, and the cooling system 220 as a whole, may be substantially optimized according to the demands of the computer systems.

Alternatively, or additionally to the above, because usage of the computer systems contained in the racks 212 may vary at different times of the day, instead of varying the position of the evaporators 222, the load placed on the computer systems may be varied. For instance, as described in co-pending U.S. application Ser. No. 10/122,010, the work load on some of the computer systems may be performed by other computer systems to substantially maximize energy efficiency of the cooling system. In this regard, the load may be transferred, for example, to one location in the room 210 if it is determined that such a load transfer is more energy efficient than under normal operating conditions. Moreover, the load transfer may occur at different times of the day and as load requirements vary.

The refrigeration system 224 may comprise any reasonably suitable type of refrigeration cycle including a vapor-compression cycle using a multi-phase working medium.

Although the refrigeration system 224 is illustrated as being located outside of the room 210, it should be understood that the refrigeration system 224 may be positioned within the room 210 without deviating from the scope of the present invention.

A cooling fluid, such as refrigerant, may be configured to flow through the evaporators 222 and return to the refrigeration system 224 via a fluid line 228. As seen in FIG. 6, the fluid line 228 generally forms a closed loop system in which the refrigerant may become heated in the evaporators 222 and cooled in the refrigeration system 224.

Although one room 210 is illustrated in FIG. 6, it should be understood that the room 210 may comprise more than one room and that the cooling system 220 may be configured to cool a plurality of rooms.

The evaporators 222 generally comprise, among other things, a plurality of fans 230 and an opening (not shown). The fans 230 are designed to cause air from the room 210 to flow into the opening, as indicated by dashed arrow 234. The fans 230 are also configured to cause the air to flow back out into the room 210, in the manner indicated by arrow 236. Thus, operation and speed of the fans 230 are adjusted to control air temperature and air flow rate. It should be understood that the evaporators 222 may include additional components and that some of the components described may be removed and/or modified without departing from the scope of the invention.

The fluid line 228 is situated to connect to the evaporators 222. In this respect, as liquid refrigerant flows through the fluid line 228 and into the evaporators 222, the refrigerant is expanded. In expanding, the refrigerant absorbs heat from the hot air 234 to provide refrigeration. Thus, heat may be transferred from the air to the refrigerant contained in the fluid line 228. Consequently, the air 236 flowing out of the evaporators 222 may be at a lower temperature relative to the air 234 entering the evaporator 222.

As will be discussed in greater detail with respect to FIG. 7 below, a valve (not shown) may be positioned upstream of each evaporator 222 along the fluid line 228. The valve may be an electronically controllable valve capable of varying the flow of refrigerant through the fluid line 228, as well as substantially stopping the flow of the refrigerant. As a result, the mass flow rate of the refrigerant through the fluid line 228 extending through the evaporator 222 may be manipulated at predetermined levels such that the temperature of the air flowing out of the evaporator 222 may be substantially optimized.

In this respect, the temperature of the refrigerant may thus be further controlled. By way of example, the temperature of the refrigerant may be increased prior to its introduction into a given evaporator 222 in a multi-evaporator system (see e.g., FIG. 7). In this type of configuration, when one rack 212 is dissipating a greater amount of heat relative to another rack 212, the temperature of cooling air flow supplied to each of these racks may differ from one another. That is, the rack 212 dissipating the greater amount of heat may receive air flow from a first evaporator 222 that is at a lower temperature compared to the rack that is dissipating a lesser amount of heat. Consequently, the temperature of the refrigerant introduced into that first evaporator may be at a lower temperature than the refrigerant introduced into a second evaporator.

A temperature sensor 248, e.g., a thermocouple or the like, is illustrated on the rack 212. A single temperature sensor 248 is depicted in FIG. 6 for purposes of simplicity, it should, however, be understood that a plurality of temperature sensors 248 may be positioned at various locations of the rack 212 as well as other areas of the room 212. In other words, the temperature sensors 248 are distributed temperature sensors. The temperature sensor 248 may supply temperature readings to a controller (not shown) configured to operate the evaporator 222, and the valve (not shown). In addition, the temperature readings may also be supplied to a controller (not shown) configured to operate the refrigeration system 224. The manner of information transmittal between the temperature sensor 248 and the controllers may comprise any reasonably suitable arrangement, e.g., wired or wireless connection.

In place of, or in addition to, the temperature sensor 248, a mobile device (not shown) designed to gather or measure at least one local environmental condition (e.g., temperature, air flow, humidity, etc.) in the room 210 may be implemented. By way of example, a suitable mobile device may comprise the environmental condition detecting device described in co-pending U.S. application Ser. No. 10/157, 892, filed on May 31, 2002 entitled "CONTROLLED COOLING OF A DATA CENTER", by Patel et al., which is assigned to the assignee of the present invention and incorporated by reference herein in its entirety. Information gathered by the mobile device may be transmitted to the controller, which may vary operation of the cooling system 220 in response to the information.

Alternatively, or in addition to, the above-described environmental condition sensing devices, the amount of heat generated by the computer systems contained in the racks 212, and the resulting necessary cooling requirements, may be anticipated according to the amount of load placed on the computer systems. A suitable method of implementing anticipated sensing is described in co-pending U.S. application Ser. No. 09/970,707, which is assigned to the assignee of the present invention and incorporated by reference herein in its entirety.

Figure 7:
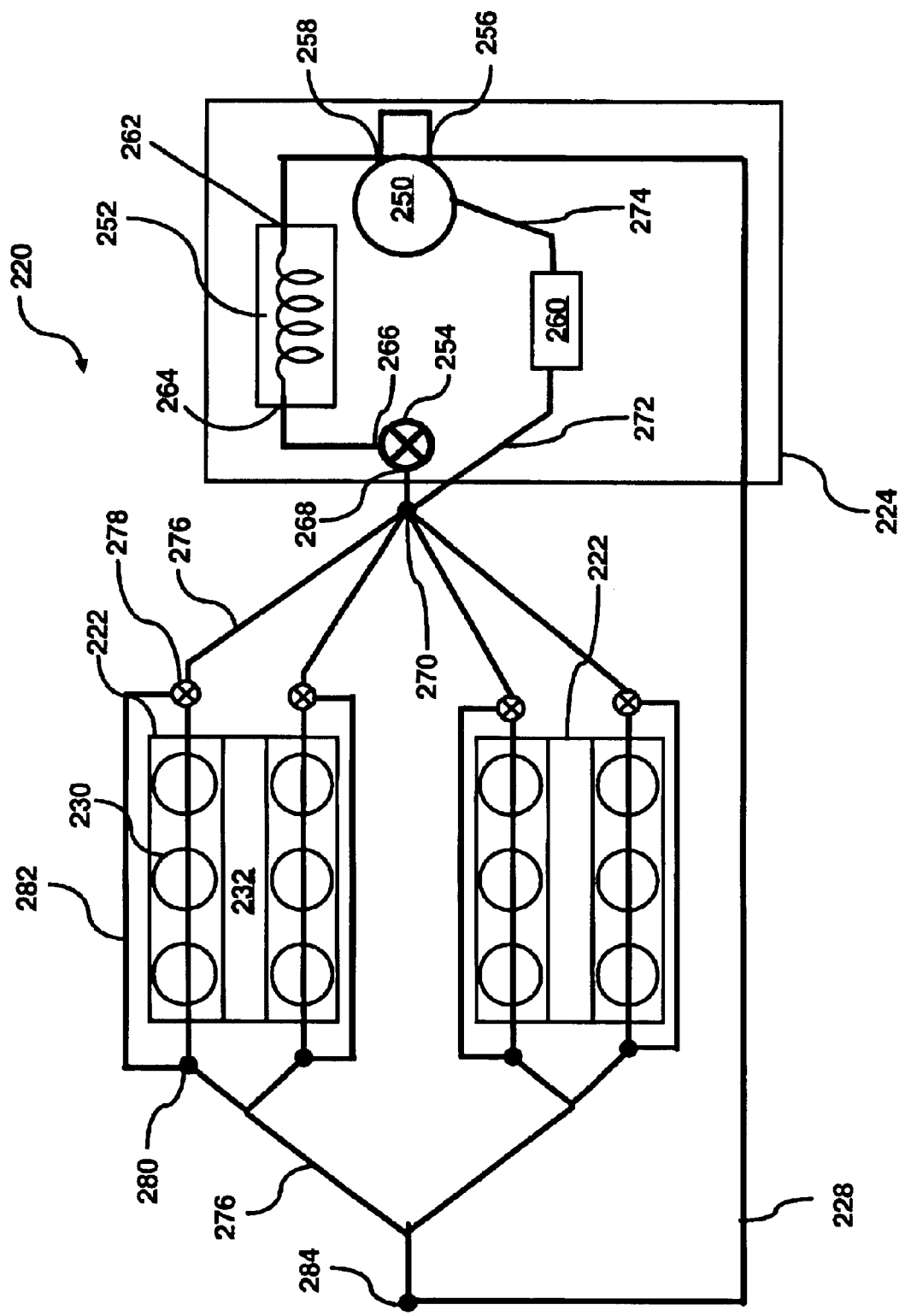
FIG. 7 is a schematic illustration of a portion of the cooling system of FIG. 6.

Referring now to FIG. 7, there is shown a schematic illustration that illustrates a plurality of evaporators 222 and a fluid line 228 emanating from the refrigeration system 224. The illustration also shows that the evaporators 222 include rows of fans 230 located adjacent to openings 232. It is contemplated that each of the evaporators 222 may include two separate evaporator units, corresponding to the separate rows of fans 230. Alternatively, it is contemplated that each of the evaporators 222 may include just a single evaporator unit corresponding to both rows of fans 230. In addition, located generally upstream of the evaporators 222 are respective valves 278, which may comprise thermal electric valves, thermal expansion valves, or the like. The refrigeration system 224 may control the supply of refrigerant through the plurality of evaporators 222. In addition, it may be seen that the valves 278 generally enable control of refrigerant flow through respective fluid line 228.

In this respect, the temperature of the air flowing out of the evaporators 222, and more specifically, out of each side of the evaporators 222 may be controlled in a substantially independent manner. In one regard, the flow of refrigerant through certain evaporators 222 may be restricted or substantially halted, for instance, in situations where the computer systems for which an evaporator 222 is configured to cool are in idle states. It should be understood that the configuration of evaporators 222, fluid line 228, and valves 278 depicted in FIG. 7 is but one manner of a variety of different obtainable configurations. It should also be understood that the specific configuration for any given room may depend upon a multitude of factors, e.g., cooling needs, room configuration, refrigeration system type, etc. In addition, the fluid line 228, and/or the evaporators 222 may be positioned above or below the fans 230 such that air may substantially be cooled prior to or subsequent to flowing into the fans 230 without deviating from the scope of the present invention.

In accordance with the principles of the present invention, temperature variation among racks in a data center may be reduced through the use of the refrigeration system 224. In this respect, air temperatures of certain parts of the room 210 may be controlled to remain relatively constant (approximately within 5° C.) with respect to other parts of the room 210, while allowing for multiple fluctuating heat loads among the racks 212. That is, according to the principles of the present invention, the mass flow rate of refrigerant flowing into each evaporator 222 is independently metered to compensate for the amount of heat load for each respective rack 212 while the temperature of refrigerant entering each evaporator 222 is substantially equal.

In FIG. 7, the cooling system 220 is illustrated as including a plurality of evaporators 222 which are connected in parallel. The cooling system 220 is a multi-load refrigeration system, which, as referenced throughout the present disclosure, generally refers to refrigeration systems having a plurality of evaporators for cooling multiple heat loads. Because the specific type of evaporator to be used in the present invention will vary according to individual needs, the present invention is not limited to any specific type of evaporator and may thus utilize any type of evaporator which may reasonably accomplish certain goals of the present invention. Examples of suitable evaporators employable in the present invention are available from LYTRON, Inc. of Woburn, Mass., LIEBERT Corporation of Columbus, Ohio, and MODINE Manufacturing Company of Racine, Wis. However, as is readily apparent to those of ordinary skill in the art, any other suitable evaporators may be used in the present invention without departing from the scope and spirit of the present invention, including automotive and consumer appliance types of evaporators.

Additionally, although FIG. 7 depicts two side-by-side evaporators 222, it is to be understood that the present invention is not limited to two evaporators in a side-by-side parallel arrangement, but rather, the present invention may include any reasonable number of evaporators in any arrangement. In one respect, the number of evaporators may correspond to the number racks 212 of FIG. 6. Accordingly, the two evaporators depicted in FIG. 7 are for illustrative purposes only and thus are not meant to limit the present invention in any respect. Additionally, as is well known to those having ordinary skill in the art, the term "parallel" describes the manner in which a single conduit is separated into a plurality of conduits, such that, the flow of refrigerant through each of the conduits may be independently controlled.

Referring still to FIG. 7, the multi-load refrigeration system 220 possesses a closed loop for refrigerant to flow to and from the evaporators 222. The refrigeration system 220 includes the plurality of evaporators 222, a compressor 250, a condenser 252, and a valve 254. The condenser 252 and the valve 254 of the present invention may include any number of known or heretofore known condensers and valves and thus includes any type of condenser and valve which substantially adequately performs their respective functions within a refrigeration system. Examples of valves suitable for use with the present invention include expansion valves such as capillary tubes, constant pressure expansion valves, and the like.

Additionally, any suitable type of refrigerant may be utilized in the present invention. In fact, the choice of refrigerant will depend upon a plurality of factors, e.g., cooling requirements, environmental impact, cost, etc. Generally speaking, suitable refrigerants include the suite of vapor-compression hydrocarbon refrigerants (CFCs, HCFSs, HFCs or any blend of pure refrigerants). Specific examples of suitable refrigerants include R134a, R290, R600, etc. Moreover, suitable refrigerants may be obtained from any commercial refrigerant manufacturer (e.g., TONG TAI INTERNATIONAL located in Taiwan, R.O.C.).

According to the embodiment illustrated in FIG. 7, the compressor 250 is a variable speed compressor. In other words, the compressor 250 may be controlled to either increase or decrease the mass flow rate of the refrigerant therethrough. Therefore, this embodiment provides for energy efficient thermal management by virtue of the variability of the variable speed compressor 250. According to the principles of the present invention, a number of different types of variable speed compressors may be utilized for proper operation of the present invention. Thus, in similar fashion to other types of vapor-compression refrigeration systems, the refrigerant flowing through the refrigerant line 228 changes between a gas and a liquid at various positions as the refrigerant circuits the closed loop of the refrigeration system 220.

In operation, refrigerant flowing into each of the evaporators 222 is individually metered. In one respect, the mass flow rate of the refrigerant flowing into each of the evaporators 222 is generally dependent upon the amount of heat produced by a respective rack in the proximity of each evaporator 222. That is, because the level of cooling of the racks (or the air in the immediate vicinity thereof) depends upon the amount of refrigerant flowing into the evaporators 222, the mass flow rate of the refrigerant is metered to allow a controlled amount of refrigerant to enter into the respective evaporators 222. Additionally, according to an embodiment of the invention, the evaporators 222 only receive a relatively necessary amount of refrigerant to adequately cool each respective rack without allowing any significant amount of liquid refrigerant to flow into the compressor 250. In this respect, evaporators 222 in the proximity of respective racks that are producing relatively less heat than other racks may receive relatively less refrigerant. Thus, the temperatures of the racks in a data center may be maintained at a relatively constant temperature to thereby reduce any temperature variation among the racks.

Referring again to FIG. 7, refrigerant enters the variable speed compressor 250 through a compressor inlet 256. The variable speed compressor 250 increases the pressure and temperature of the refrigerant before the refrigerant exits through a compressor outlet 258. The speed of the compressor 30 and thus the level of compression of the refrigerant may be controlled by a proportional, integral, derivative controller with relay ("PID") 260. The controller 260 may also comprise a microprocessor, a micro-controller, an application specific integrated circuit (ASIC), a programmable logic controller (PLC), and the like. The manner in which the compression level is controlled by altering compressor speed will be discussed in greater detail hereinbelow.

The refrigerant thus flows out of the compressor 250 and through the refrigerant line 228 into the condenser 252 through a condenser inlet 262. Within the condenser 252, the refrigerant begins to decrease in temperature while remaining at a constant pressure until the refrigerant reaches a saturation point. The refrigerant exits the condenser 252 through a condenser outlet 264, typically as a liquid (still at a relatively high pressure and temperature). The refrigerant then flows through the refrigerant line 228 into the expansion valve 254 through an expansion valve inlet 266. The pressure of the refrigerant is reduced within the expansion valve 254.

After exiting the expansion valve 254 through an expansion valve outlet 268, the refrigerant flows past a sensor 270 which measures the evaporator saturation temperature ("$T_{sat}$") of the refrigerant. Although any suitable type of temperature sensor may be utilized in the present invention, examples of suitable temperature sensors include a thermocouple, thermistor, pressure sensing device if the refrigerant is azeotropic (i.e., evaporator saturation temperature is constant over phase change), and the like. The sensor 270 is connected to the PID 260 via an input line 272. The PID 260 is also connected to the variable speed compressor 250 via an output line 274. The PID 260 is configured to control the speed of the compressor 250 and thus the level of compression the variable speed compressor 250 applies on the refrigerant based upon the measured $T_{sat}$ to thereby control the mass flow rate of the refrigerant throughout the refrigeration system 224. Although any suitable PID may be utilized with the present invention, examples of suitable PIDs include those manufactured by OMEGA Inc. of Stamford, Conn., and WATLOW ELECTRIC MANUFACTURING CO. of St. Louis, Mo. The refrigerant then flows through the refrigerant line 228, which branches out into four evaporator refrigerant lines 276. The evaporator refrigerant lines 276 lead the refrigerant to the evaporators 222, and converge back to refrigerant line 228.

As illustrated in FIG. 7, evaporator valves 278 are provided upstream of respective evaporators 222 to individually meter the flow of refrigerant into each of the evaporators 222. It is to be understood that a specific type of evaporator valve 278 is not required to be utilized with the present invention, but rather, any suitable type of controllable metering valve, e.g., a thermal electric valve, may be utilized. An example of a suitable evaporator valve employable in the present invention includes the 625 Series Valves manufactured by PARKER-HANNIFIN CORP. of Cleveland, Ohio. It is also contemplated that one or more of the evaporator valves 278 could be an expansion valve to be used instead of or in conjunction with the expansion valve 254.

As further illustrated in FIG. 7, sensors 280 (e.g., thermocouples, thermistors, pressure sensing devices, etc.) are positioned downstream of respective evaporators 222. The sensors 280 are configured to measure the temperature of the refrigerant ("$T_{evap,out}$" or "$\Delta T_{sup}$") as it exits the respective evaporators 222. The evaporator valves 278 respond to changes in the $T_{evap,out}$ to meter the flow of the refrigerant into each of the evaporators 222. In one respect, a change in the $T_{evap,out}$ may cause a bimetallic strip inside the respective evaporator valve 278 to actuate thus manipulating the evaporator valve to vary the flow of refrigerant into the respective evaporators 222. The change in temperature may be relayed to the evaporator valves 276 via respective temperature signal lines 282. After the refrigerant exits the evaporators 222, the refrigerant is once again introduced back into the refrigerant line 228 such that the entire refrigeration process may be repeated. In addition, a sensor 284 (e.g., thermocouple, thermistor, pressure sensing device, etc.) is provided between the evaporators 222 and the variable speed compressor 250 so that the suction temperature ("$T_{suction}$") may be measured.

Figure 8:
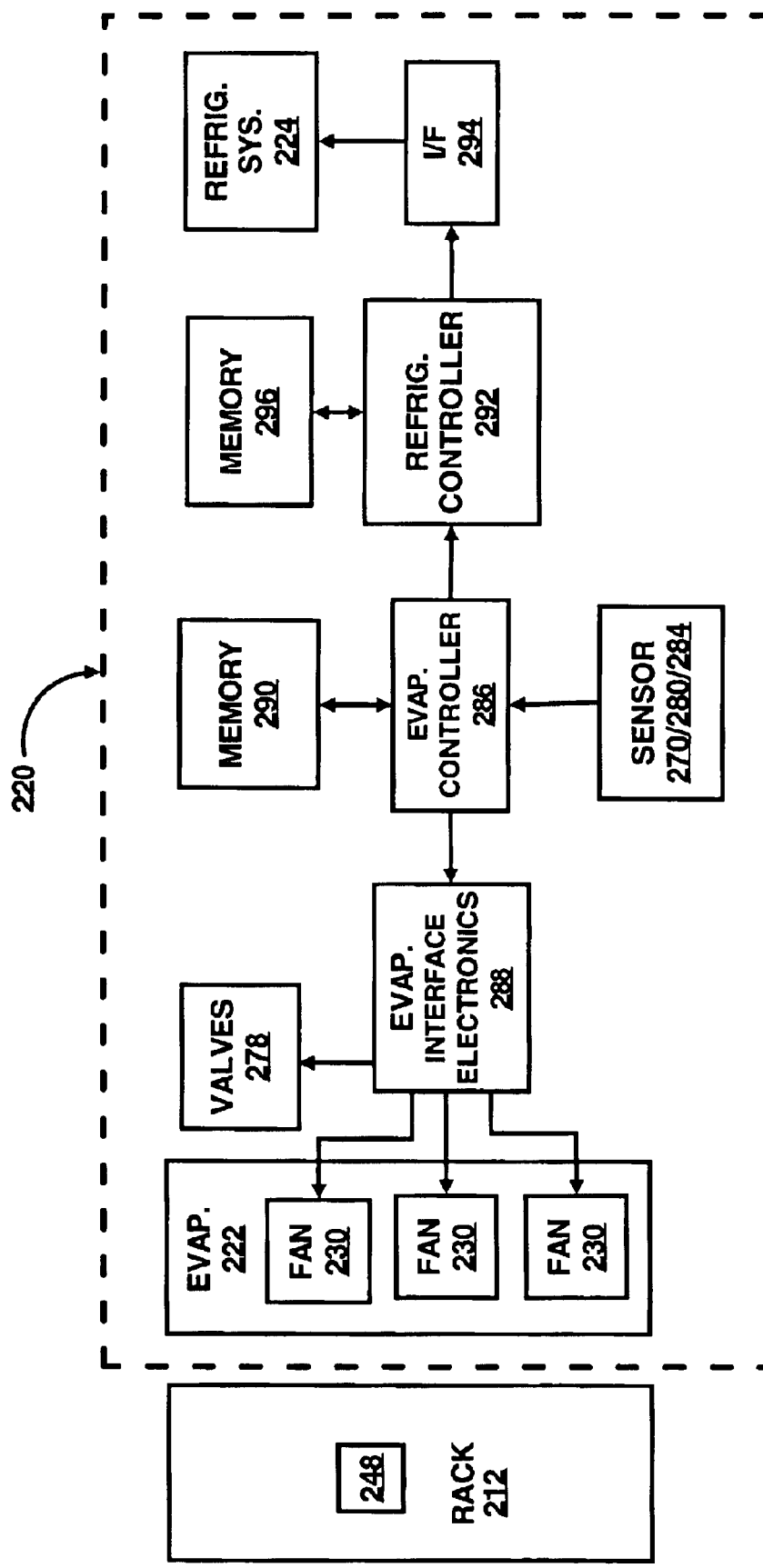
FIG. 8 is an exemplary block diagram for a cooling system according to another embodiment of the invention.

FIG. 8 is an exemplary block diagram for the cooling system 220 according to all embodiments of the present invention. It should be understood that the following description of the block diagram is but one manner of a variety of different manners in which such a cooling system 220 may be operated. In addition, it should be understood that the cooling system 220 may include additional components and that some of the components described may be removed and/or modified without departing from the scope of the invention.

The cooling system 220 includes a controller 286 configured to control the operations of the evaporator 222. The controller 286 may comprise a microprocessor, a micro-controller, an application specific integrated circuit (ASIC), and the like. The controller 286 may, for example, control the power and speed of the fans 230, and the operation of the valves 278. Interface electronics 288 may be provided to act as a control interface between the controller 286 and the evaporator 222, fans 230, and valves 278. Alternatively, a control interface my be omitted between the controller 286 and the above-described components. The controller 286 may also be interfaced with a sensor 270, 280, and/or 284, e.g., one or more of the sensors described hereinabove with respect to FIG. 7.

The controller 286 may be interfaced with a memory 290 configured to provide storage of computer software that provides the functionality of the controller 286, e.g., the speed of the fans, pump operation, etc. The evaporator memory 290 may be implemented as a combination of volatile and non-volatile memory, such as dynamic random access memory (DRAM), EEPROM, flash memory, and the like. The memory 290 may also be configured to provide a storage for containing data and/or information pertaining to the manner in which controller 286 may operate the fans 230 and the valves 278. In one respect, the manner of operation of the above-described components may be based according to temperature measurements by any or all sensor(s) 270, 280, and 284.

The controller 286 may be further interfaced with a refrigeration system controller 292. The interface may be effectuated via a wired protocol, such as IEEE 802.3, etc., wireless protocols, such as IEEE 801.11b, wireless serial connection, Bluetooth, etc., or combinations thereof.

The refrigeration system controller 292 may be configured to control the operations of the refrigeration system 224. The refrigeration system controller 292 may comprise a microprocessor, a micro-controller, an application specific integrated circuit (ASIC), and the like. The refrigeration system controller 292 is generally configured to manipulate the temperature of the refrigerant by controlling the operation of the refrigeration system 224. More particularly, the refrigeration system controller 292 may be designed to vary the operation of the refrigeration system 224 to vary the amount of heat transfer on the refrigerant contained in the refrigeration loop of the refrigeration system 224. It is contemplated that the refrigeration system controller 292 and controller 286 can be integrated into a single controller instead of two separate controllers.

Interface electronics (I/F) 294 may be provided to act as an interface between the refrigeration system controller 292 and the components for operating the refrigeration system 224, e.g., the supply of voltage to vary the speed of the compressor, etc.

The refrigeration system controller 292 may also be interfaced with memory 296 configured to provide storage of a computer software that provides the functionality of the refrigeration system 224 and may be executed by the refrigeration system controller 292. The memory 296 may be implemented as a combination of volatile and non-volatile memory, such as DRAM, EEPROM, flash memory, and the like. The memory 296 may also be configured to provide a storage for containing data/information pertaining to the manner in which the compressor (heat exchanger, chiller) may be manipulated in response to, for example, variations in the temperature of the refrigerant and/or air in the room.

In one respect, the capacity (e.g., the amount of work exerted on the refrigerant) of the compressor may be modified to thereby control the temperature and of the refrigerant. The compressor may thus be controlled to either increase or decrease the mass flow rate of the refrigerant flowing therethrough. Consequently, when the temperature in the room is below a predetermined range, the capacity of the compressor may be reduced to substantially reduce the amount of work, thus the amount of energy exerted on the refrigerant. This may lead to a significant reduction in the costs associated with operating the cooling system as compared with conventional cooling systems.

Because the specific type of compressor to be employed with embodiments of the invention may vary according to individual needs, the invention is not limited to any specific type of compressor. Instead, any reasonably suitable type of compressor capable of accomplishing certain aspects of the invention may be employed with the embodiments of the invention. The choice of compressor may therefore depend upon a plurality of factors, e.g., cooling requirements, costs, operating expenses, etc.

By way of example, if there is a detected or anticipated change in the temperature of a rack 212, areas surrounding the rack 212, etc., the controller 286 may operate to manipulate the corresponding evaporator 222 and/or fan(s) 230 to compensate, e.g., change the mass flow rate, velocity, and other characteristic of the air flow, for the change in temperature. In addition, or as an alternative to the above, the controller 286 may operate to cause the refrigeration system 224 to lower the refrigerant temperature. In this respect, each of the racks 212 and/or portions thereof may generally receive substantially only the amount of cooling air necessary to maintain the temperature of the racks 212 within a predetermined temperature range. In addition, the refrigerant temperature, and therefore the air temperature, may also be controlled as needed to substantially optimize cooling of the racks 212. By controlling the cooling air flow in the above-described manner, the cooling system 220 may be operated at substantially optimized levels, thereby decreasing the amount of energy and thus the operating costs required to cool the computer systems in the racks 212.

Moreover, the controller 286 may operate the compressor in a manner to vary the refrigerant temperature in response to various degrees of detected increases/decreases in the operation of the evaporator 222. More particularly, a look up table (not shown) may be stored in the memory 296. The look up table may include information pertaining to the level of compressor speed increase necessary for a detected increase in the operation of the evaporator 222. In this respect, the compressor speed may be varied substantially incrementally in response to detected changes in the operation of the evaporator 222.

Figure 9:
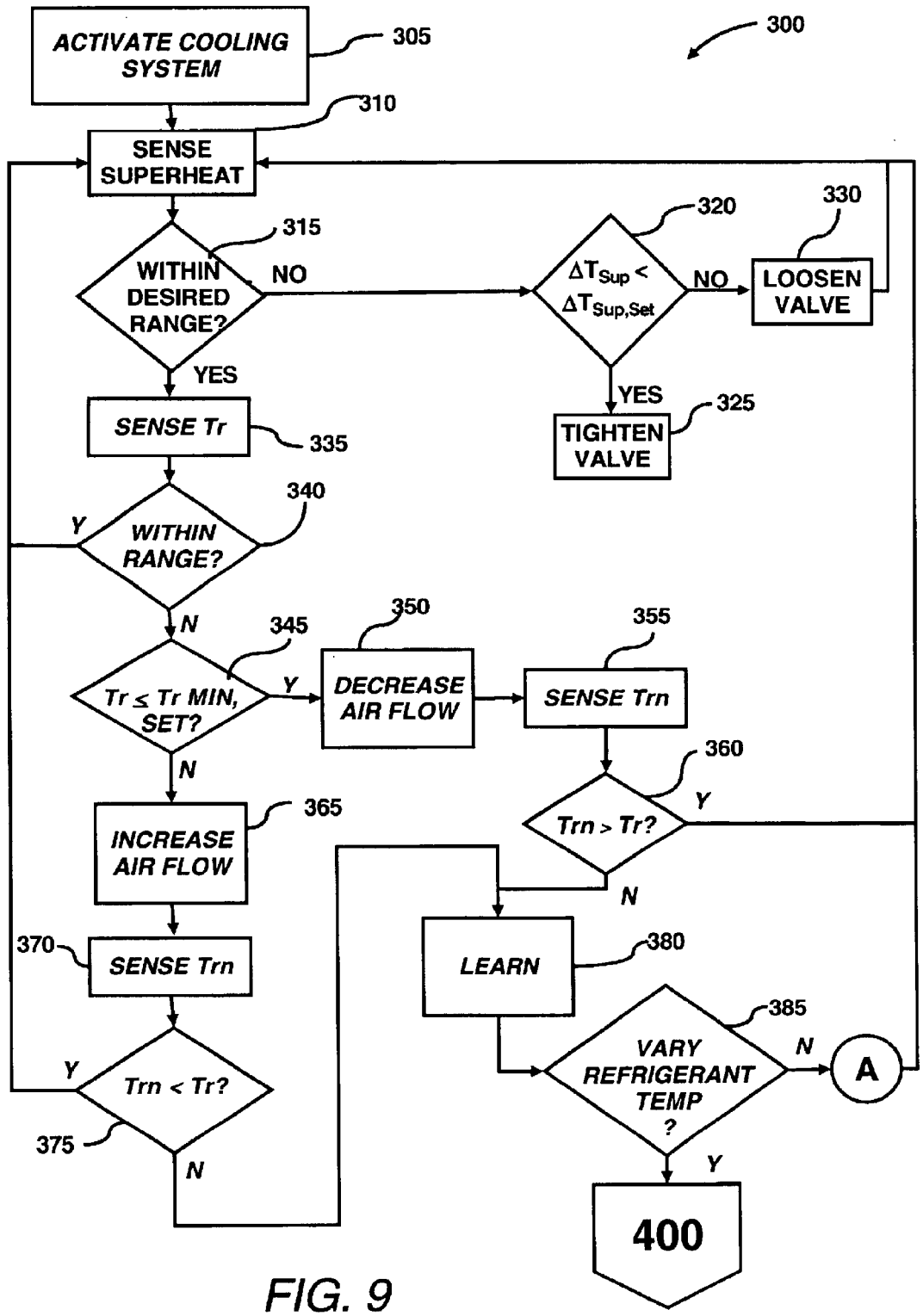
FIG. 9 shows a flow diagram of an operational mode according to another embodiment of the invention.

FIG. 9 shows a flow diagram of an operational mode 300 according to an embodiment of the invention. It should be understood that the operational mode 300 may include additional operations and that some of the operations may be removed and/or modified without departing from the scope of the invention. The following description of the operational mode 300 is made with reference to FIGS. 6–8, and thus makes reference to the elements cited therein.

The operations illustrated in the operational mode 300 may be contained as a utility, program, or a subprogram, in any desired computer accessible medium. In addition, the operational mode 300 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

In the operational mode 300, the cooling system 220 is activated at step 305. At step 310, the evaporator superheat temperature ("$\Delta T_{sup}$") for each of the evaporators 222 is sensed by the respective sensors 280. At step 315, it is determined whether the $\Delta T_{sup}$ for each of the evaporators 222 is within a predetermined desired range. If the $\Delta T_{sup}$ for one of the evaporators 222 is within the desired range, then no change is made to the evaporator valve 278 of that evaporator and the process proceeds to step 335. If, however, the $\Delta T_{sup}$ is not within the desired range for any of the evaporators 222, the $\Delta T_{sup}$ for that evaporator 222 is compared to an evaporator superheat set point ("$\Delta T_{sup,set}$") at step 320. The $\Delta T_{sup,set}$ for each of the evaporators 222 is about between 0–5° C. and may be set to be approximately the same for each of the evaporators 222.

Thus, for example, if the $\Delta T_{sup}$ for one evaporator 222 is lower than the $\Delta T_{sup,set}$ for that evaporator 222, the evaporator valve 278 for that evaporator 222 is manipulated by a controlled amount to decrease the mass flow rate of the refrigerant flowing into the evaporator 222 at step 325. In addition, by manipulating the evaporator valve 278 to reduce the mass flow of the refrigerant through the evaporator 222, the $T_{sup}$ may be increased and the $T_{sat}$ may be reduced.

If, on the other hand, the $\Delta T_{sup}$ for one evaporator 222 is not less than the $\Delta T_{sup,set}$ for that evaporator 222, the evaporator valve 278 for that evaporator 222 is manipulated to increase the mass flow of the refrigerant therethrough by a controlled amount as indicated at step 330. By way of increasing the mass flow rate of the refrigerant through that evaporator 222, the $T_{sup}$ may decrease and the $T_{sat}$ may increase. After the evaporator valves 278 have been manipulated to either increase or decrease the flow of refrigerant therethrough, the process returns to step 310.

It is to be understood that by way of the principles of the present invention, each of the evaporators 222 may be independently metered. More specifically, any one or all of the evaporator valves 278 may be manipulated to decrease the flow of refrigerant therethrough while another one of the evaporator valves is manipulated to increase the flow of refrigerant therethrough.

Thus, although specific reference is made to the manner of controlling one evaporator 212 and one evaporator valve 278, it is to be understood that steps 310–330 are carried out for each of the evaporators 222, independently of one another and may be done simultaneously.

At step 335, the temperature of one or more racks at any given time (Tr) is sensed by temperature sensors, e.g., one or more temperature sensors 248. The temperature sensors 248 may comprise one or more of the above-described temperature sensors, e.g., thermocouple, mobile environmental condition sensing device, etc. The Tr's generally correspond to the heat load of the heat dissipating components and therefore the computer systems contained in the racks, e.g., rack 212. Therefore, the Tr's may be based upon the temperatures of specific heat dissipating components and subsystems. In addition, the Tr's may be based upon the temperatures in the general vicinity of the racks and/or sections of the racks. Thus, those skilled in the art will understand that embodiments of the present invention may be employed to monitor Tr's with temperature sensors 248 located at various positions throughout the room and not only on or near the racks 212. Moreover, use of the term "rack" herein generally refers to racks for supporting computer systems and additionally to sections of the racks as well as areas around the racks. Therefore, the use of the term "rack" throughout the present disclosure is not meant to limit certain aspects thereof to entire racks, but instead, is relied upon to simplify the description of embodiments of the present invention.

As an alternative to the temperature sensor 248, the Tr's may be anticipated in the manner described hereinabove and in co-pending U.S. patent application Ser. No. 09/970,707.

At step 340, it is determined whether each of the Tr's is within a predetermined range of operating temperatures, e.g., between a maximum set point temperature (Tmax,set) and a minimum set point temperature (Tmin,set). In general, the range of temperatures Tmin,set and Tmax,set pertains to threshold temperatures to determine whether to increase or decrease the flow of cooling air delivered to the racks. This range of operating temperatures may be set according to a plurality of factors. These factors may include, for example, the operating temperatures set forth by the manufacturers of the subsystems and components located in the racks, through testing to determine the optimal operating temperatures, etc. In addition, the predetermined range of operating temperatures may vary from one subsystem to another.

For those racks having Tr's that are within the predetermined range, their temperatures are sensed again at step 335, after the process returns to steps 310 and 315. For those racks determined to have heat loads that do not fall within the predetermined temperature range, i.e., fall outside of Tmin,set and Tmax,set, the controller 286 may determine whether those racks have temperatures that are below the Tmin,set at step 345.

If, at step 345, it is determined that one or more Tr's are less than or equal to the Tmin, set, then the air flow supplied by the evaporator 222, and more particularly the fans 230, configured to supply cooling air flow to the racks having Tr's below or equal to the Tmin,set, may be decreased at step 350. In addition, and/or alternatively, the evaporator controller 286 may increase the flow of refrigerant through the evaporator 222 via operation of the valve(s) 278.

At step 355, the temperatures of the racks 212 are sensed again a subsequent time (Trn). The effect of decreasing the air flow is evaluated at step 360. Here, Trn is compared to Tr, wherein if Trn is greater than Tr, such that decreasing the air flow had its intended effect, then the process returns to step 310. If, however, Trn is not greater than Tr, such that decreasing the air flow did not have its intended effect, then the process proceeds to step 380.

If, at step 345, it is determined that one or more Tr's are greater than Tmin,set, then the air flow may be increased at step 365. In this regard, the controller 286 may increase power to the fans 230 to enable greater air flow to the racks 212. In addition, and/or alternatively, the evaporator controller 286 may increase the flow of refrigerant through the evaporator 222 via operation of the valve(s) 278.

At step 370, the temperatures of the racks are sensed again a subsequent time (Trn). The effect of increasing the air flow is evaluated at step 375. Here, Trn is compared to Tr, wherein if Trn is less than Tr, such that increasing the air flow had its intended effect, then the process returns to step 310. If, however, Trn is not less than Tr, such that increasing the air flow did not have its intended effect, then the process proceeds to step 380.

By virtue of certain embodiments of the invention, racks having various Tr's may be supplied with air flow having various characteristics, e.g., temperature, velocity, direction, and the like. That is, for example, in a system comprising a plurality of evaporators 222, air flow may be supplied to racks having higher Tr's by certain evaporators 222 substantially simultaneously with air flow supplied to racks 212 having relatively lower Tr's by other evaporators 222 where each of the racks 212 receives different levels of air flow. Additionally, the temperature of the refrigerant supplied through the evaporators 222 delivering air flow to racks having higher Tr's may be relatively lower than the temperature of the refrigerant supplied through the evaporators 222 delivering air flow to racks having lower Tr's. It should thus be appreciated that steps 350 and 365 may be respectively and substantially simultaneously performed by various evaporators 222. More particularly, on a zonal level, temperature readings determined at step 335 for various racks may be implemented in varying the delivery of cooling air to the various racks. Additionally, on a global level, the temperature of the refrigerant may be varied according to the changes in the cooling requirements of the racks. For example, when the temperature of a rack exceeds a predetermined threshold range, the evaporator(s) 222 supplying cooling air flow to that rack may increase the air flow to that rack. Substantially concurrently, the temperature of the refrigerant may be decreased by an amount relative to the increased rack temperature.

According to an embodiment of the invention, the decrease in mass flow rate and/or velocity of the air flow at step 350 and the increase in volume and/or velocity of the air flow at step 365 may be accomplished by incrementally varying the air flow from the evaporator 222. For example, the volume flow rate and/or velocity of the air flow from the evaporator 222 may be varied by a predetermined amount during a first iteration. The Tr may be measured at a predetermined time following the variation and steps 335–365 may be repeated. By repeating this process a number of times, the temperature of the rack may be substantially brought within the predetermined range without having to adjust refrigerant temperature.

At step 380, one or more of the controllers 286 or 292 and memory 290 or 296 are configured to adapt or learn from errors in a prescribed course of action, i.e. record when the change in air flow at steps 350 and 365 did not have the intended effect of correctly adjusting Tr. Accordingly, the controller(s) can attempt to take an opposite course of action the next time the same or similar condition is present. For example, if an increase in air flow at step 365 resulted in Trn being greater than Tr in a given location, then the controller (s) can learn from this unintended effect and instead decrease the air flow the next time such a condition is present in the given location. In addition, step 380 can be used as input to a computational fluid dynamics tool that will be described in greater detail below.

At step 385 the controller 292 may determine whether to vary the refrigerant temperature, e.g., increase the compressor speed. For example, the refrigerant temperature may be decreased in response to, for example, fan speed and actual and/or detected increases in Tr. In other words, if any fan associated with any evaporator is at maximum speed and a respective Tr (or Tr's) exceeds the predetermined temperature range, then the compressor speed can be increased (and vice versa). Thus, the goal in this example is to achieve optimal energy efficiency by permitting the refrigerant to maintain its highest possible temperature, primarily using the fans to deliver cooling air at a temperature and flow rate that is adequate to cool the racks. As such, a lower limit is necessarily placed on fan speed so that a minimum mass flow rate of air is delivered to the room from the evaporators.

If the controller(s) determines not to vary the refrigerant temperature at step 385, then the process returns to step 310. In addition, the steps following step 310 may be repeated for an indefinite period of time and may form a closed-loop pattern. Alternatively, if the controller determines to vary the refrigerant temperature, then the process proceeds from step 385 to operational mode 400 of FIG. 10.

Figure 10:
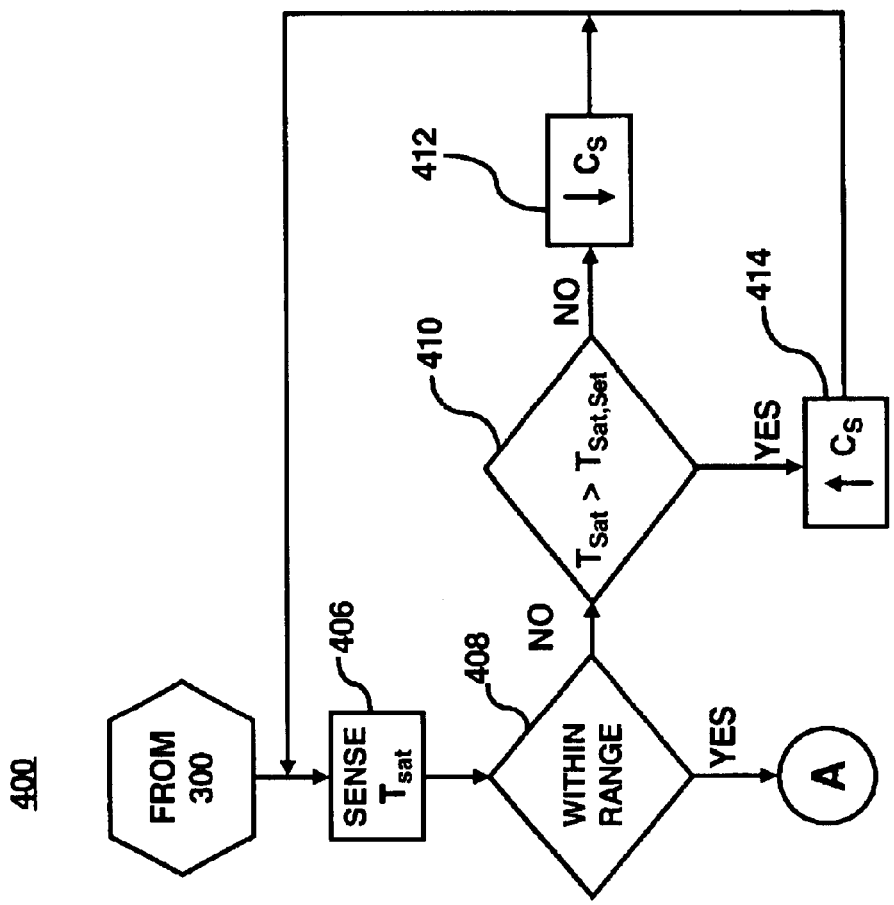
FIG. 10 shows a flow diagram of another operational mode according to the embodiment of FIG. 9.

FIG. 10 is a flow diagram depicting an operational mode 400 in which the embodiment illustrated in FIGS. 6–8 may be practiced. Accordingly, the following description of FIG. 10 will be made with particular reference to those features illustrated in FIGS. 6–8. As seen in FIG. 10, after an affirmative decision at step 385 in FIG. 9 is made, the $T_{sat}$ is measured at step 406. The $T_{sat}$ measurement is then relayed to the PID 260 via the input line 272 where it is then compared to a predetermined range at step 408. The predetermined range in step 408 is determined based upon system design and the amount of load variability to be expected among the racks. In general, the predetermined range may depend upon the following: electrical timing requirements, allowable mechanical stress due to thermal expansion, proximity to dew point, etc. If it is determined that the $T_{sat}$ is indeed within the predetermined range, then the process proceeds back to step 310 as indicated by marker A. If, however, it is determined that the $T_{sat}$ is not within the predetermined range, it is then determined whether the $T_{sat}$ is higher than an evaporator saturation temperature set point ("$T_{sat,set}$") at step 410. The $T_{sat,set}$ may be determined by determining the optimum operating temperature of each rack and is a function of rack design, rack packaging, the efficiency of the thermal connection between the evaporator and the rack, the design of the evaporator, flow rate of the refrigerant, refrigerant properties, and the like.

If the $T_{sat}$ is equal to or below the $T_{sat,set}$, the speed of the variable speed compressor 250 is reduced by a controlled amount at step 412. By reducing the speed of the variable speed compressor 250, the mass flow rate of the refrigerant entering into the evaporators 222 will be decreased and the $T_{sat}$ will be increased. If, on the other hand, the $T_{sat}$ is higher than the $T_{sat,set}$, the speed of the variable speed compressor 250 is increased by a controlled amount at step 414. Increasing the speed of the variable speed compressor 250 has the effect of increasing the mass flow rate of the refrigerant entering into the evaporators while reducing the $T_{sat}$. After each of steps 412 and 414, the $T_{sat}$ is measured once again and the process is repeated at step 406.

Figure 11:
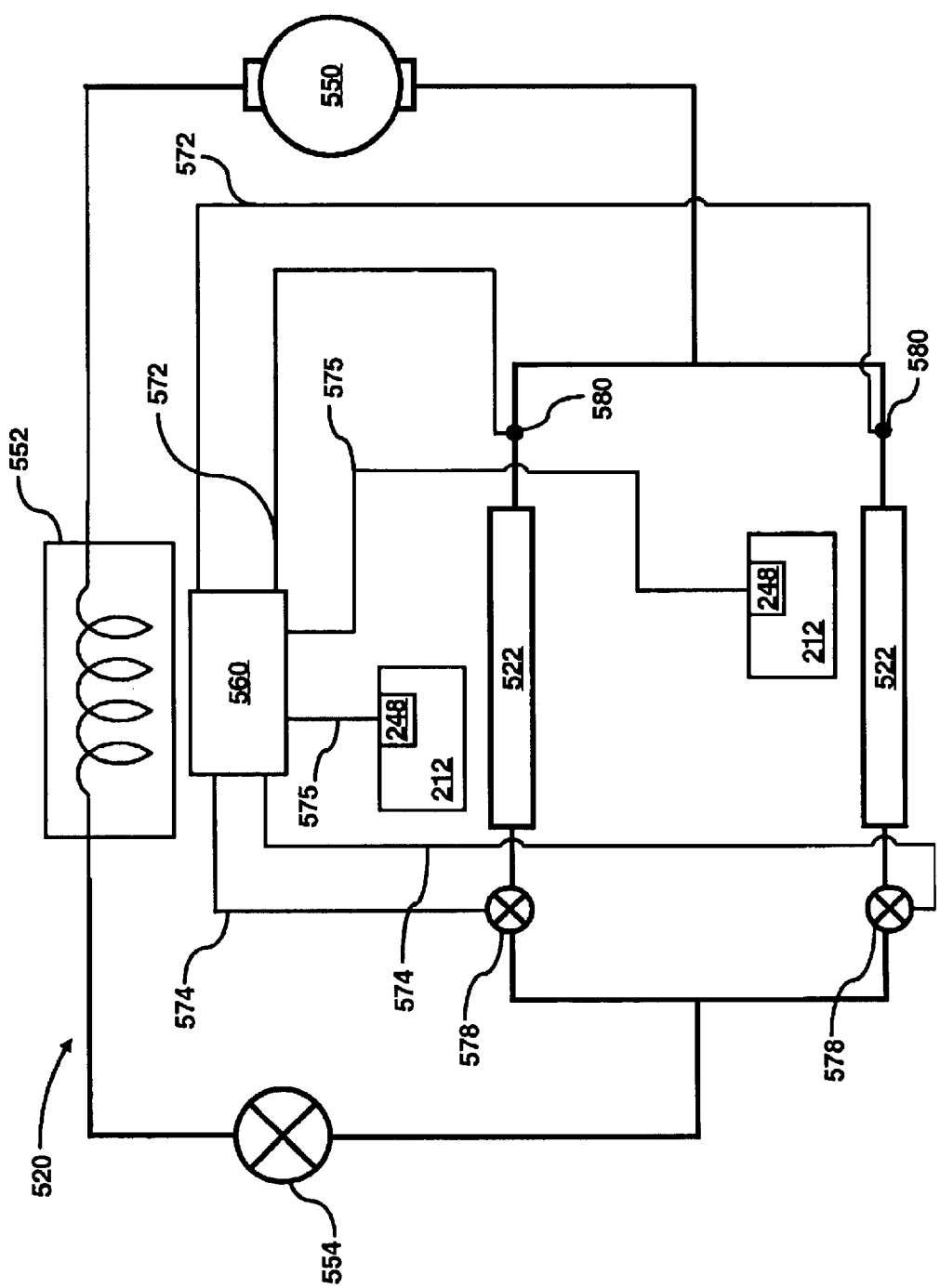
FIG. 11 is a schematic illustration of a cooling system according to another embodiment of the present invention.

FIG. 11 illustrates yet another embodiment incorporating the principles of the present invention. A cooling system 520 of this embodiment is similar to the cooling system 220 as described hereinabove with respect to FIG. 6 and thus only those features which are reasonably necessary for a complete understanding of the embodiment of FIG. 11 are described hereinbelow. Two differences are that cooling system 520 includes a constant speed compressor 550 and a programmable logic controller ("PLC") 560. This embodiment provides for thermal management with proper provisioning of inefficient cooling resources. A constant speed compressor 550 is a relatively inefficient cooling resources, but is relatively cheaper and more reliable. This embodiment enables better distribution of cooling resources by independent control of air temperature via control of evaporator superheat.

The cooling system 520 includes a condenser 552, an expansion valve 554, and a plurality of vapor temperature signal lines 572 connected to respective sensors 580 for relaying evaporator superheat temperature readings from the sensors 580 to the PLC 560. Moreover, a plurality of control signal lines 574 are connected from the PLC 560 to respective evaporator valves 578 upstream of respective evaporators 522.

In addition, FIG. 11 depicts the racks 212 to be cooled and shows that each of the temperature sensors 248 are in communication with the PLC 560 via a plurality of rack temperature lines 575. In this respect, according to the principles of the embodiment illustrated in FIG. 11, the temperatures of the racks 212 may be directly relayed to the PLC 560. However, it is within the purview of the present disclosure that the temperature of the racks 212 may be measured by any reasonable means. Modifications to the position of temperature measurement may be accomplished without deviating from the scope and spirit of the present invention.

Figure 12:
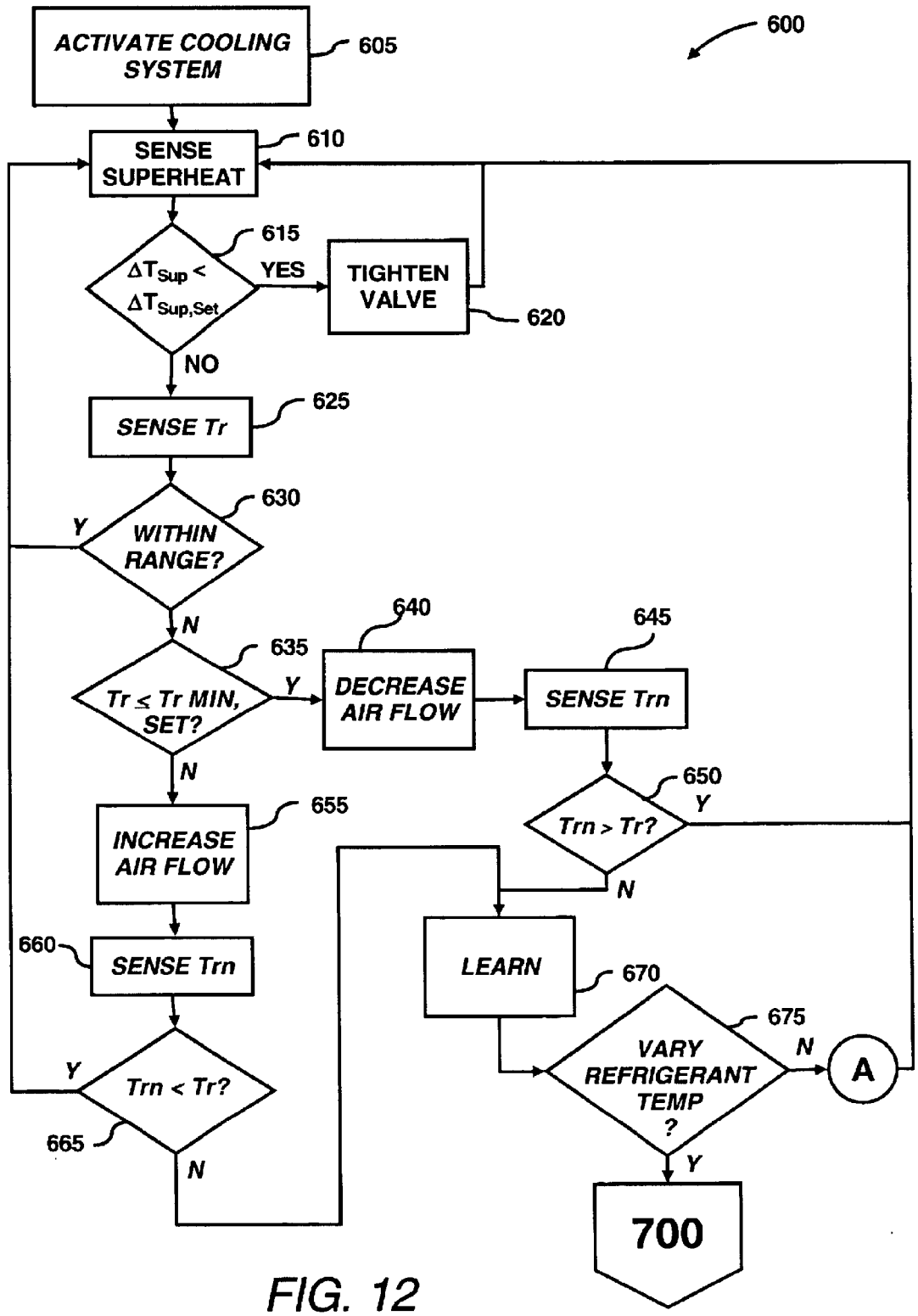
FIG. 12 shows a flow diagram of yet another operational mode according to the embodiment of FIG. 11.

FIG. 12 shows a flow diagram of the operational mode 600 according to another embodiment of the present invention that is similar to that described in FIG. 9 in which the description thereof is incorporated by reference herein. It should be understood that the operational mode 600 may include additional operations and that some of the operations may be removed and/or modified without departing from the scope of the invention. The following description of the operational mode 600 is made with reference to FIG. 11, and thus makes reference to the elements cited therein.

In the operational mode 600, the cooling system 520 is activated at step 605. At step 610, the evaporator superheat temperature ("$\Delta T_{sup}$") for each of the evaporators 522 is sensed by the respective sensors 580. At step 615, the $\Delta T_{sup}$ for each of the evaporators 522 is compared to a $\Delta T_{sup}$,set. The $\Delta T_{sup}$,set for each of the evaporators 522 is about between 0–5° C. and may be set to vary among the evaporators 522. For illustrative purposes only, the following example is made with particular reference to one evaporator 522 and its related components. It is to be understood that each of the following steps are equally applicable to the other evaporators 522 and their relative components, and the steps may be carried out on the other evaporators 522 concurrently with the steps described hereinbelow with respect to any one evaporator 522. Thus, for example, if the $\Delta T_{sup}$ for evaporator 522 is lower than the $\Delta T_{sup}$,set for that evaporator, the respective evaporator valve 578 is manipulated to decrease the mass flow rate of refrigerant therethrough by a controlled amount at step 620. By decreasing the mass flow rate of refrigerant through the evaporator valve 578, the $T_{sat}$ may be reduced, while the $\Delta T_{sup}$ and the rack temperature Tr may be increased. After the mass flow rate of the refrigerant through the evaporator valve 578 has been reduced, the $\Delta T_{sup}$ for each of the evaporators is sensed and checked again at steps 610 and 615.

According to the principles of the above-described embodiment, the amount of refrigerant flowing into each of the evaporators 522 may be independently metered by the evaporator valves 578. Thus, the temperature of the racks 512 may be controlled according to the superheat temperature of the refrigerant flowing out of the evaporators 522.

At step 625, the temperature of one or more racks (Tr) is sensed by temperature sensors, e.g., one or more temperature sensors 548. The temperature sensors 548 may comprise one or more of the above-described temperature sensors, e.g., thermocouple, mobile environmental condition sensing device, etc. The Tr's generally correspond to the heat load of the heat dissipating components and therefore the computer systems contained in the racks, e.g., rack 512. Therefore, the Tr's may be based upon the temperatures of specific heat dissipating components and subsystems. In addition, the Tr's may be based upon the temperatures in the general vicinity of the racks and/or sections of the racks. Thus, those skilled in the art will understand that embodiments of the present invention may be employed to monitor Tr's with temperature sensors 548 located at various positions throughout the room and not only on or near the racks 512.

Moreover, use of the term "rack" herein generally refers to racks for supporting computer systems and additionally to sections of the racks as well as areas around the racks. Therefore, the use of the term "rack" throughout the present disclosure is not meant to limit certain aspects thereof to entire racks, but instead, is relied upon to simplify the description of embodiments of the present invention.

As an alternative to the temperature sensor 548, the Tr's may be anticipated in the manner described hereinabove and in co-pending U.S. patent application Ser. No. 09/970,707.

At step 630, it is determined whether each of the Tr's is within a predetermined range of operating temperatures, e.g., between a maximum set point temperature (Tmax,set) and a minimum set point temperature (Tmin,set). In general, the range of temperatures Tmin,set and Tmax,set pertains to threshold temperatures to determine whether to increase or decrease the flow of cooling air delivered to the racks. This range of operating temperatures may be set according to a plurality of factors. These factors may include, for example, the operating temperatures set forth by the manufacturers of the subsystems and components located in the racks, through testing to determine the optimal operating temperatures, etc. In addition, the predetermined range of operating temperatures may vary from one subsystem to another.

For those racks having Tr's that are within the predetermined range, their temperatures are sensed again at step 625, after the process returns to steps 610 and 615. For those racks determined to have heat loads that do not fall within the predetermined temperature range, i.e., fall outside of Tmin,set and Tmax,set, the controller 586 may determine whether those racks have temperatures that are below the Tmin,set at step 635.

If, at step 635, it is determined that one or more Tr's are less than or equal to the Tmin, set, then the air flow supplied by the evaporator 522, and more particularly the fans 530, configured to supply cooling air flow to the racks having Tr's below or equal to the Tmin,set, may be decreased at step 640. At step 645, the temperatures of the racks 512 are sensed again a subsequent time (Trn). The effect of decreasing the air flow is evaluated at step 650. Here, Trn is compared to Tr, wherein if Trn is greater than Tr, such that decreasing the air flow had its intended effect, then the process returns to step 610. If, however, Trn is not greater than Tr, such that decreasing the air flow did not have its intended effect, then the process proceeds to step 670.

If, at step 635, it is determined that one or more Tr's are greater than Tmin,set, then the air flow may be increased at step 655. In this regard, the controller 586 may increase power to the fans 530 to enable greater air flow to the racks 512. At step 660, the temperatures of the racks are sensed again a subsequent time (Trn). The effect of increasing the air flow is evaluated at step 665. Here, Trn is compared to Tr, wherein if Trn is less than Tr, such that increasing the air flow had its intended effect, then the process returns to step 610. If, however, Trn is not less than Tr, such that increasing the air flow did not have its intended effect, then the process proceeds to step 670.

By virtue of certain embodiments of the invention, racks having various Tr's may be supplied with air flow having various characteristics, e.g., temperature, velocity, direction, and the like. That is, for example, in a system comprising a plurality of evaporators 522, air flow may be supplied to racks having higher Tr's by certain evaporators 522 substantially simultaneously with air flow supplied to racks 512 having relatively lower Tr's by other evaporators 522 where each of the racks 512 receives different levels of air flow. Additionally, the temperature of the refrigerant supplied through the evaporators 522 delivering air flow to racks having higher Tr's may be relatively lower than the temperature of the refrigerant supplied through the evaporators 522 delivering air flow to racks having lower Tr's. It should thus be appreciated that steps 640 and 655 may be respectively and substantially simultaneously performed by various evaporators 522. More particularly, on a zonal level, temperature readings determined at step 625 for various racks may be implemented in varying the delivery of cooling air to the various racks. Additionally, on a global level, the temperature of the refrigerant may be varied according to the changes in the cooling requirements of the racks. For example, when the temperature of a rack exceeds a predetermined threshold range, the evaporator(s) 522 supplying cooling air flow to that rack may increase the air flow to that rack. Substantially concurrently, the temperature of the refrigerant may be decreased by an amount relative to the increased rack temperature.

According to an embodiment of the invention, the decrease in mass flow rate and/or velocity of the air flow at step 640 and the increase in volume and/or velocity of the air flow at step 655 may be accomplished by incrementally varying the air flow from the evaporator 522. For example, the volume flow rate and/or velocity of the air flow from the evaporator 522 may be varied by a predetermined amount during a first iteration. The Tr may be measured at a predetermined time following the variation and steps 625–655 may be repeated. By repeating this process a number of times, the temperature of the rack may be substantially brought within the predetermined range without having to adjust refrigerant temperature.

At step 670, one or more of the controllers 586 or 592 and memory 590 or 596 are configured to adapt or learn from errors in a prescribed course of action, i.e. record when the change in air flow at steps 640 and 655 did not have the intended effect of correctly adjusting Tr. Accordingly, the controller(s) can attempt to take an opposite course of action the next time the same or similar condition is present. For example, if an increase in air flow at step 655 resulted in Trn being greater than Tr in a given location, then the controller(s) can learn from this unintended effect and instead decrease the air flow the next time such a condition is present in the given location. In addition, step 670 can be used as input to a computational fluid dynamics tool that will be described in greater detail below.

At step 675 the controller 592 may determine whether to vary the refrigerant temperature, e.g. by decreasing mass flow rate through the evaporators 522 based on measured evaporator superheat temperatures. Moreover, the refrigerant temperature may be decreased in response to, for example, fan speed and actual and/or detected increases in Tr. The goal in this example is to achieve optimal energy efficiency by permitting the refrigerant to maintain its highest possible temperature, primarily using the fans to deliver cooling air at a temperature and flow rate that is adequate to cool the racks. As such, a lower limit is necessarily placed on fan speed so that a minimum mass flow rate of air is delivered to the room from the evaporators.

If the controller(s) determines not to vary the refrigerant temperature at step 675, then the process returns to step 610. In addition, the steps following step 610 may be repeated for an indefinite period of time and may form a closed-loop pattern. Alternatively, if the controller determines to vary the refrigerant temperature, then the process proceeds from step 675 to operational mode 700 of FIG. 13.

Figure 13:
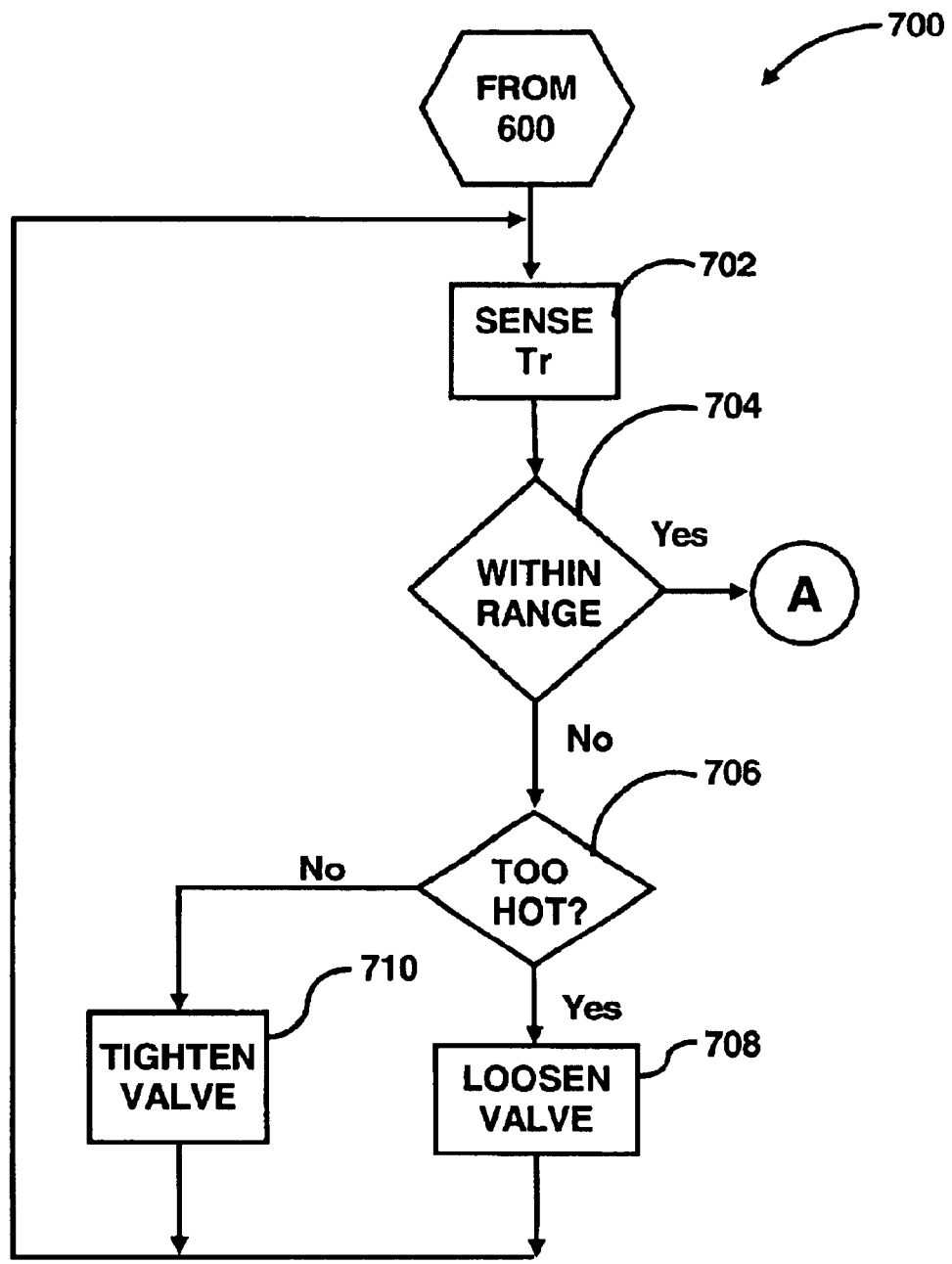
FIG. 13 shows a flow diagram of an operational mode associated with the operational mode of FIG. 12.

FIG. 13 is a flow diagram 700 depicting a manner in which the embodiment illustrated in FIG. 11 may be practiced. Accordingly, the following description of FIG. 13 will be made with particular reference to the features illustrated in FIG. 11. As seen in FIG. 13, after an affirmative decision at step 670 in FIG. 12 is made, the Tr is sensed (e.g., with a thermocouple) at 702. The temperature of the rack is relayed to the PLC 560 via temperature lines 575. It is then determined whether the Tr is within a predetermined range at step 704. The predetermined range in step 704 is determined based upon system design and the amount of load variability expected among the racks. In general, the predetermined range may depend upon the following: electrical timing requirements, allowable mechanical stress due to thermal expansion, proximity to dew point, etc. If the Tr is within the predetermined range, the amount of refrigerant flowing through the evaporator valve 578 is unchanged and the process returns to the operational mode 600 of FIG. 12 as indicated by marker A.

If, however, the Tr is outside the predetermined range, the Tr is compared to a set point temperature to determine whether the Tr is too hot at step 706. The set point temperature is a preferable operating temperature of the component and is generally provided by the component manufacturer. The preferable operating temperature is normally determined based upon the computer equipment manufacturers recommended inlet air temperature, based on a number different factors. If the Tr is too hot, then the PLC 560 sends a signal via control signal line 574 to the respective evaporator valve 578 instructing the valve increase the mass flow rate of refrigerant therethrough by a controlled amount at step 708. By increasing the mass flow rate of the refrigerant flowing into the evaporator 522, the $T_{sat}$ may be increased, while the Tr and the ΔTsup may be decreased.

If the Tr is not too hot, the PLC 560 sends a signal via control signal line 574 to evaporator valve 578 instructing the valve to decrease the mass flow rate of refrigerant therethrough by a controlled amount at step 710. By decreasing the mass flow rate of the refrigerant flowing into the evaporator 522, the $T_{sat}$ may be decreased, while the Tr and the ΔTsup may be increased. After these measures have been taken, the Tr is checked again at step 702 and the process repeats.

In accordance with embodiments of the present invention, the cooling requirements of a room configured to house computer systems may be analyzed to substantially optimize the layout of the racks within the room. In one respect, the substantial optimization of the rack layout in the room may enable the cooling system of the data center to operate at generally lower energy and greater efficiency levels by virtue of the reduced workload placed on the components of the cooling systems, e.g., compressors, evaporators, etc. In addition, the cooling requirements may be analyzed to optimize the workload of the computer systems as described above. In this regard, the actual or anticipated temperatures may be stored in a look-up table and used as references in optimizing the room layout and/or workload distribution. The cooling requirements within the room may be analyzed by operation of any reasonably suitable commercially available computational fluid dynamics (CFD) tool, e.g., FLOVENT, a 6-D modeling software capable of predicting temperature variations based upon fluid flow analyses.

By virtue of the numerical modeling, various cooling devices as well as the evaporators described hereinabove may be positioned throughout the room to substantially control the manner in which the racks receive the cooling fluid.

In addition, the cooling devices may also be positioned to substantially maximize and optimize their performances, e.g., to prevent one or more of the cooling devices from operating at substantially excessive levels.

In determining the cooling air distribution requirement within the room, each of the racks may be assigned a heat load which may correspond to a maximum heat load predicted for that rack, e.g., through anticipated power draw. For example, a rack containing 40 subsystems, e.g., computers, may have a maximum heat load of 10 KW and a rack containing 50 subsystems may have a maximum heat load of 5 KW. By implementing the CFD in this manner, for example in a room containing 100 racks, four cooling devices, and a plurality of evaporators, racks having a potential for relatively larger heat loads may be relatively separately located throughout the data center. In one respect, therefore, the cooling devices and the evaporators within the room may be operated at substantially less than maximum power levels while the racks may receive sufficient amounts of cooling fluid. More specifically, the power required to operate the cooling devices and the evaporators may be regulated to efficiently supply cooling fluid to the racks by providing substantially only that amount of cooling fluid necessary to maintain the racks within nominal operating temperatures.

Additionally, a CFD tool may be implemented substantially simultaneously with the cooling system. More specifically, the CFD tool may be utilized to substantially continuously vary the operation of the cooling system to operate according to the heat loads generated in the racks. In this regard, the anticipated or actual heat loads (e.g., based upon the power draw of the components) on the racks may be inputted into the CFD tool, along with one or more of the following properties: velocity of the cooling fluid flowing through various sections of the room and the distribution of temperature and pressure of the cooling fluid in the data center, to determine an optimal manner in which, for example, the evaporators may be operated. The velocity of the air flow as well as other atmospheric conditions at various locations within the room may be sensed by a temperature sensor. The sensed conditions may be transmitted or otherwise relayed to the CFD tool to enable the tool to perform the necessary calculations.

In this regard, the CFD tool may be implemented to produce a numerical model of the room to thus determine an optimized cooling distribution within the room. A correlation of one or more of the following properties: velocity of the cooling fluid flowing through various sections of the room, distribution of temperature and pressure of the cooling fluid in the room, and the power draw into the racks, may be created based on the numerical modeling. The correlation may be used to infer thermal conditions throughout the room when only a minimum number of sensors are available during operation of the cooling system. In addition, the correlation may substantially reduce the amount of time required for the CFD tool to perform the computing operations.

By virtue of certain embodiments of the present invention, one of ordinary skill in the art will readily recognize that the amount of energy, and thus the costs associated with cooling the racks located within a room may be substantially reduced. In one respect, by operating the cooling system to supply cooling fluid substantially only as needed by the racks to keep the racks at substantially the same temperature within a predetermined range, the cooling system may be operated at a relatively more efficient manner in comparison with conventional cooling systems.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for cooling a room configured to house a plurality of computer systems, said method comprising:
providing a plurality of evaporator units distributed in parallel along refrigerant lines and configured to receive air from said room and to deliver air to said room;
supplying said plurality of evaporator units with refrigerant through the refrigerant lines, wherein an evaporator valve is positioned upstream of each of said plurality of evaporator units, wherein said refrigerant is operable to cool said air in said plurality of evaporator units;
sensing temperatures at one or more locations in said room;
controlling the temperature of said air in response to said step of sensing temperatures at said one or more locations;
sensing a superheat temperature of said refrigerant exiting from at least one of said plurality of evaporator units; and
varying the refrigerant supplied to each of said plurality of evaporator units in response to the sensed superheat temperature through operation of said evaporator valves to control the temperature of said air.

2. The method according to claim 1, further comprising:
providing a refrigeration system configured to manipulate the temperature of said refrigerant, wherein said controlling step comprises varying an output of said refrigeration system to control the temperature of said refrigerant.

3. The method according to claim 2, wherein said refrigeration system comprises a refrigeration loop having a variable speed compressor and having at least one expansion valve, wherein the evaporator valves are configured to meter flow of said refrigerant through at least one of said plurality of evaporator units, and wherein said step of controlling the temperature of said refrigerant comprises controlling the operation of said variable speed compressor.

4. The method according to claim 2, wherein said plurality of evaporator units comprises at least one fan configured to effectuate delivery of said air, and wherein said step of controlling at least one of the temperature of said refrigerant and said air comprises varying an output of said fan to control the delivery of air to the room.

5. The method according to claim 4, further comprising:
determining whether said temperatures at said one or more locations in said room are within a predetermined range.

6. The method according to claim 5, further comprising:
determining whether said temperatures are at least one of less than and equal to a minimum set point temperature in response to said temperatures at one or more locations in said room being outside of said predetermined range.

7. The method according to claim 6, wherein said controlling step comprises at least one of the following steps:
decreasing delivery of said air to said room in response to said temperatures at said one or more locations being at least one of less than and equal to said minimum set point temperature; and
increasing delivery of said air to said room in response to said sensed temperatures being above said minimum set point temperature and outside of said predetermined range.

8. The method according to claim 7, further comprising:
sensing temperatures again at one or more locations in said room; and
recording whether said decreasing and said increasing steps had their intended effect.

9. The method according to claim 8, further comprising:
using said recording step to provide input to performing a numerical modeling of temperature distribution and flow characteristics of said air within said room.

10. The method according to claim 5, further comprising:
varying at least one of the amount of said refrigerant and the temperature of said refrigerant in response to the said temperatures at one or more locations in said room being outside of said predetermined range.

11. The method according to claim 10, further comprising:
sensing a saturation temperature of said refrigerant;
increasing the speed of said variable speed compressor in response to said saturation temperature exceeding a saturation temperature set point; and
decreasing the speed of said variable speed compressor in response to said saturation temperature being less than or equal to said predetermined saturation temperature set point.

12. The method according to claim 11,
wherein the step of varying the refrigerant supplied to each of said plurality of evaporator units comprises manipulating said evaporator valve to decrease the flow of refrigerant through said at least one of said plurality of evaporator units in which said superheat temperature of said refrigerant is outside a predetermined superheat temperature range and said superheat temperature of said refrigerant is less than an evaporator superheat temperature set point for said at least one of said plurality of evaporator units; and
manipulating said evaporator valve to increase the flow of refrigerant through said at least one of said plurality of evaporator units in which said superheat temperature of said refrigerant is outside said predetermined superheat temperature range and said superheat temperature of said refrigerant exceeds or is equal to said evaporator superheat temperature set point for said at least one of said plurality of evaporator units.

13. The method according to claim 1, further comprising:
varying the amount of refrigerant delivered to said at least one of said plurality of evaporator units to maintain said plurality of computer systems at substantially similar temperatures.

14. The method according to claim 1, further comprising:
performing a numerical modeling of temperature distribution and flow characteristics of air within the room; and
manipulating said refrigeration system in response to said numerical modeling.

15. The method according to claim 14, further comprising:
implementing said numerical modeling to correlate at least two of temperature, velocity and pressure of said refrigerant and power draw of said plurality of computer systems to thereby infer a thermal condition throughout said room, wherein said controlling step further comprises manipulating said refrigeration system in response to said thermal condition.

16. The method according to claim 1, wherein said step of sensing temperatures at one or more locations in said room comprises sensing said temperatures with a mobile environmental condition sensing device.

17. The method according to claim 1, wherein said step of sensing temperatures at one or more locations in said room comprises determining said temperatures according to anticipated heat loads of one or more of said plurality of computer systems.

18. The method according to claim 1, further comprising:
manipulating the workload on said plurality of computer systems to optimize energy efficiency in cooling said plurality of computer systems.

19. The method according to claim 1, wherein said step of controlling at least one of the temperature of said refrigerant and said air in response to said temperatures at said one or more locations comprises substantially ceasing air delivery and refrigerant delivery in response to said sensed temperatures being below a predetermined set point temperature.

20. The method according to claim 1, further comprising:
providing a refrigeration system configured to manipulate the temperature of said refrigerant, wherein said step of controlling at least one of the temperature of said refrigerant and said air comprises varying an output of said refrigeration system to control the temperature of said refrigerant.

21. The method according to claim 20, further comprising:
controlling the flow of said refrigerant through said refrigeration system, said refrigeration system having a constant speed compressor and a plurality of valves that meter the flow of said refrigerant respectively through said plurality of evaporator units;
checking a superheat temperature of said refrigerant flowing through said plurality of evaporator units;
manipulating said plurality of valves to decrease the flow of refrigerant respectively through said plurality of evaporator units for each of said plurality of evaporator units in which the respective superheat temperature is less than an evaporator superheat temperature set point; and
sensing a temperature associated with those evaporator units in which said superheat temperature exceeds or is equal to said superheat temperature set point.

22. The method according to claim 21, further comprising:
determining whether said temperature is within a predetermined temperature range; and
determining whether said temperature is above a predetermined temperature for those evaporator units in which said temperature is outside said predetermined rack temperature range.

23. The method according to claim 22, further comprising:
manipulating said plurality of valves to respectively decrease the flow of refrigerant through said plurality of evaporator units for each of those evaporator units in which said temperature is below said predetermined temperature range; and
manipulating said plurality of valves to respectively increase the flow of refrigerant through said plurality of evaporator units for those evaporator units in which said temperature exceeds said predetermined temperature range.

24. The method according to claim 23, further comprising:
manipulating a main valve positioned upstream of said plurality of valves to control the flow of said refrigerant.

25. The method according to claim 24, further comprising:
manipulating said main valve to decrease the flow of said refrigerant therethrough when at least one of said plurality of computer systems has a temperature exceeding said predetermined temperature range; and
manipulating said main valve to increase the flow of refrigerant therethrough when at least one of said plurality of computer systems has a temperature falling below said predetermined temperature range.

26. A system for cooling a room containing a plurality of computer systems, said system comprising:
a plurality of evaporator units distributed in parallel and configured to receive refrigerant through a refrigerant line and to receive air, wherein said air may be cooled through heat transfer with said refrigerant, said plurality of evaporator units having at least one fan configured to cause said air to flow out of said plurality of evaporator units;
an evaporator controller operable to control a supply of said refrigerant to said plurality of evaporator units and operable to control the speed of said at least one fan;
a refrigeration system for cooling said refrigerant;
a refrigeration system controller configured to operate said refrigeration system to vary the temperature of said refrigerant; and
at least one valve configured to meter the flow of said refrigerant through said plurality of evaporator units positioned along said refrigerant line generally upstream of said plurality of evaporator units, wherein said evaporator controller is operable to control the mass flow rate of said refrigerant through said at least one valve.

27. The system according to claim 26, further comprising one or more temperature sensors, wherein said evaporator controller is configured to receive environmental condition information from said one or more temperature sensors.

28. The system according to claim 27, wherein said temperature sensor comprises at least one of a thermocouple and a mobile environmental condition sensing device.

29. The system according to claim 26, wherein said plurality of computer systems are housed in a plurality of racks, and wherein a plurality of heat exchanger units are positioned at various locations in said room to supply air flow to said plurality of racks in a substantially independent manner.

30. The system according to claim 26, further comprising:
a variable speed compressor for controlling the flow of said refrigerant through said refrigerant line; and
a refrigeration system controller configured to control said variable capacity compressor.

31. The system according to claim 30, wherein said at least one valve comprises a plurality of valves corresponding to said plurality of evaporator units and further comprises an expansion valve upstream of said plurality of valves.

32. The system according to claim 30, further comprising a proportional, integral, derivative controller including an input line from a sensor located along said refrigerant line upstream of said plurality of evaporator units and an output line connected to said variable speed compressor, wherein said proportional, integral, derivative controller is capable of sending signals to said variable speed compressor to vary the speed of said refrigerant in response to a saturation temperature measurement of said refrigerant by said sensor.

33. The system according to claim 32, further comprising a plurality of sensors located along said refrigerant line downstream of said plurality of evaporator units, said plurality of sensors being in respective communication with said plurality of valves to thereby respectively meter the amount of said refrigerant entering said plurality of evaporator units.

34. The system according to claim 32, wherein said refrigeration system controller is configured to communicate with said evaporator controller.

35. The system according to claim 34, wherein said communication between said refrigeration system controller and said evaporator controller includes communication of information pertaining to the level of operation of said plurality of evaporator units, and wherein said refrigeration system controller is configured to operate said variable speed compressor in response to said information.

36. The system according to claim 35, wherein said communication comprises at least one of temperature measurements and evaporator unit operations.

37. The system according to claim 26, wherein said plurality of evaporator units is supported from a ceiling of said room.

38. The system according to claim 26, further comprising:
 a constant speed compressor within said refrigeration system;
 a plurality of refrigerant temperature sensors in communication with said evaporator controller and respectively positioned downstream of said plurality of evaporator units;
 a plurality of distributed temperature sensors in communication with said evaporator controller;
 a plurality of temperature signal lines connecting said evaporator controller to said plurality of refrigerant temperature sensors and said plurality of distributed temperature sensors;
 a plurality of valves positioned generally upstream of and inline with said plurality of evaporator units; and
 a plurality of control signal lines connecting said evaporator controller to said plurality of valves;
 wherein said evaporator controller is configured to send signals to each of said valves in response to temperature readings measured by at least one of said plurality of refrigerant temperature sensors and said plurality of distributed temperature sensors.

39. The system according to claim 38, wherein said evaporator controller is a programmable logic controller.

40. A system for cooling computer systems housed in one or more racks, said racks being maintained in a room, said system comprising:
 means for cooling air including means for receiving refrigerant, wherein the means for receiving refrigerant comprises refrigerant lines configured to deliver refrigerant to a plurality of means for cooling air arranged in a parallel configuration;
 means for delivering cooled air to said plurality of computer systems;
 means for measuring temperatures at one or more locations in said room;
 means for controlling delivery of said cooled air in response to said means for measuring;
 means for controlling the temperature of said refrigerant;
 means for sensing a superheat temperature of said refrigerant exiting from the means for cooling air; and
 means for varying the refrigerant supplied through said refrigerant lines in response to the sensed superheat temperature.

41. The system according to claim 40, further comprising:
 means for controlling delivery of said refrigerant through said cooling means.

42. The system according to claim 41, wherein:
 said cooling means comprises a plurality of evaporator units distributed in parallel;
 said means for controlling delivery of refrigerant comprises means for independently adjusting the flow of refrigerant through at least one of said plurality of evaporator units.

43. A computer readable storage medium on which is embedded one or more computer programs, said one or more computer programs implementing a method of cooling a room configured to house a plurality of computer systems, said one or more computer programs comprising a set of instructions for:
 providing a plurality of evaporator units distributed in parallel and configured to receive air from said room and to deliver air to said room;
 supplying said plurality of evaporator units with refrigerant, wherein said refrigerant is operable to cool said air in said plurality of evaporator units;
 sensing temperatures at one or more locations in said room;
 controlling the temperature of said air in response to said temperatures at said one or more locations;
 sensing a superheat temperature of said refrigerant exiting from at least one of said plurality of evaporator units; and
 varying the refrigerant supplied to each of said plurality of evaporator units in response to the sensed superheat temperature through operation of said evaporator valves to control the temperature of said air.

44. The computer readable storage medium according to claim 43, said one or more computer programs further comprising a set of instructions for:
 providing a refrigeration system configured to manipulate the temperature of said refrigerant, wherein said controlling step comprises varying an output of said refrigeration system to control the temperature of said refrigerant.

* * * * *